United States Patent
Eun et al.

(10) Patent No.: US 8,614,135 B2
(45) Date of Patent: Dec. 24, 2013

(54) METHODS OF MANUFACTURING PHASE CHANGE MEMORY DEVICES

(75) Inventors: Sung-ho Eun, Seoul (KR); JaeHee Oh, Seongnam-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 811 days.

(21) Appl. No.: 12/702,350

(22) Filed: Feb. 9, 2010

(65) Prior Publication Data

US 2010/0203672 A1 Aug. 12, 2010

(30) Foreign Application Priority Data

Feb. 9, 2009 (KR) .................. 10-2009-0010222

(51) Int. Cl.
*H01L 21/20* (2006.01)

(52) U.S. Cl.
USPC ........... 438/382; 438/102; 365/145; 365/148; 365/163; 257/42; 257/43; 257/4; 257/E27.104; 257/E21.663; 257/E21.068; 257/E41.002

(58) Field of Classification Search
USPC .......... 438/102, 382; 257/E21.068, 42, 43, 4, 257/E27.104, E21.663, E45.002; 365/145, 365/148, 163
See application file for complete search history.

(56) References Cited

U.S. PATENT DOCUMENTS

2008/0272355 A1* 11/2008 Cho et al. .................... 257/2

FOREIGN PATENT DOCUMENTS

| JP | 2005-051122 | 2/2005 |
| KR | 100168355 B1 | 10/1998 |
| KR | 1020050040463 A | 5/2005 |

* cited by examiner

*Primary Examiner* — Amar Movva
(74) *Attorney, Agent, or Firm* — Volentine & Whitt, PLLC

(57) ABSTRACT

A phase change memory is manufactured by providing a substrate including a layer of phase-change material, forming a damascene pattern on the layer of phase-change material, and forming both a top electrode and a bit line in the damascene pattern.

12 Claims, 21 Drawing Sheets

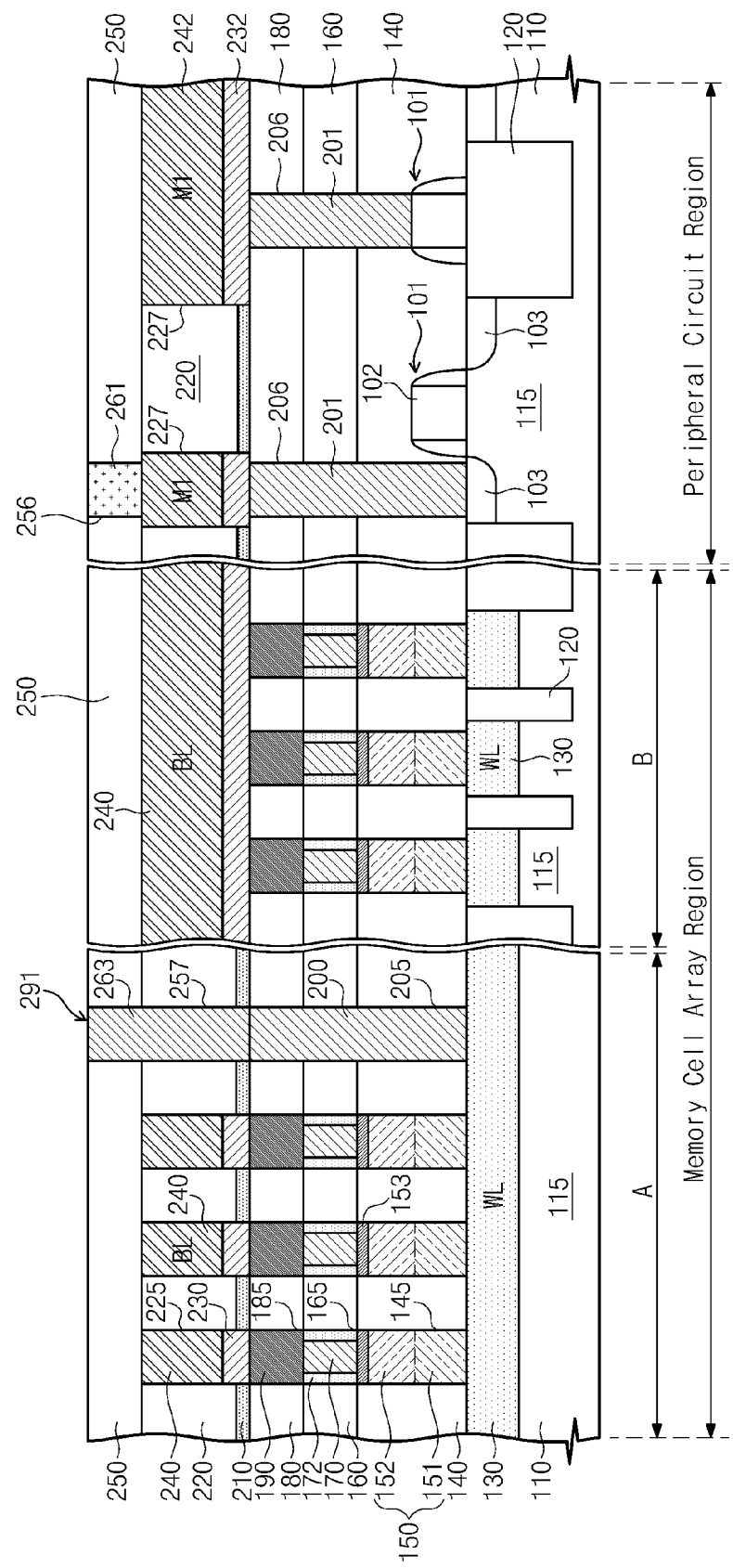

METHODS OF MANUFACTURING PHASE CHANGE MEMORY DEVICES

CROSS-REFERENCE TO RELATED APPLICATIONS

This U.S. non-provisional patent application claims priority under 35 U.S.C. §119 of Korean Patent Application No. 10-2009-0010222, filed on Feb. 9, 2009.

BACKGROUND

The present inventive concept relates to the manufacturing of memory devices. More particularly, the inventive concept relates to methods of manufacturing phase change memory devices.

Nonvolatile memory devices are widely used in many personal and commercial electronics. While some nonvolatile memory devices, such as flash memory devices, use accumulated charge to store data, other memory devices, such as resistive random access memory (RRAM), phase change RAM (PRAM), and magnetic RAM (MRAM) devices, use change in resistivity of a material thereof to store data.

A resistive memory cell generally includes a top electrode, a bottom electrode, and variable resistivity material connected therebetween. The resistive memory cell can be configured so that the resistivity of the variable resistivity material is controlled in response to a voltage that is applied between the top and bottom electrodes.

A PRAM device includes a phase change material layer which functions like the variable resistivity material. The phase change material layer may be formed from a chalcogenide material that includes Ge, Sb, and/or Te (GST). The state or phase of the phase change material layer determines its resistance. For example, when the phase change material layer has crystalline characteristics, its resistance is substantially less than when the phase change material layer has amorphous characteristics.

In response to sufficient heat, the phase of the phase change material layer is changed to change its resistance. The phase remains changed even after the temperature of the phase change material returns to its pre-heated temperature. Current is applied to an electrode of the PRAM device to heat the phase change material a sufficient amount to change its phase. Thus, the phase of the material can be controlled by controlling the level of current and/or duration of current that is applied to the electrode. In this way, the resistance of the phase change material layer in a PRAM device is controlled to set a logic state of the device, and the resistance is sensed to read the logic state as a value.

SUMMARY

According to one aspect of the inventive concept, there is provided a method of manufacturing a phase change memory device which includes providing a substrate having a layer of phase-change material, and using a damascene process to form both a top electrode on the layer of phase-change material and a bit line on the top electrode. That is, a damascene pattern is formed on the layer of phase-change material, and a top electrode and a bit line are formed discretely from one another in the damascene pattern. Accordingly, the bit line is self-aligned with the top electrode.

According to one aspect of the inventive concept, there is provided a method of manufacturing a phase change memory device which includes forming a word line at the supper surface of a semiconductor substrate, forming a first insulation layer on the semiconductor substrate, forming a diode which extends through the first insulation layer and is electrically connected to the word line, forming a bottom electrode on the diode, forming a layer of phase-change material on the diode, forming a bottom metal stud which extends through the first insulation layer and is electrically connected to the word line, forming a second insulation layer on the first insulation layer, patterning the second insulation layer to form a first contact hole which exposes the layer of phase-change material and a second contact hole which exposes the bottom metal stud, forming in the first contact hole both a top electrode electrically connected to the layer of phase-change material and a bit line self-aligned with the top electrode, and forming in the second contact hole both an intermediate metal stud electrically connected to the bottom metal stud and a top metal stud self-aligned with the intermediate metal stud.

BRIEF DESCRIPTION OF THE DRAWINGS

These and/or other aspects and utilities of the present general inventive concept will become apparent and more readily appreciated from the following description of the preferred embodiments of the inventive concept, made in conjunction with the accompanying drawings of which:

FIGS. 6A through 6D are each a cross-sectional view of a substrate and illustrate steps in still another embodiment of a method of manufacturing a phase change memory device according to the inventive concept.

DETAILED DESCRIPTION OF THE PREFERRED EMBODIMENTS

Figure 1:
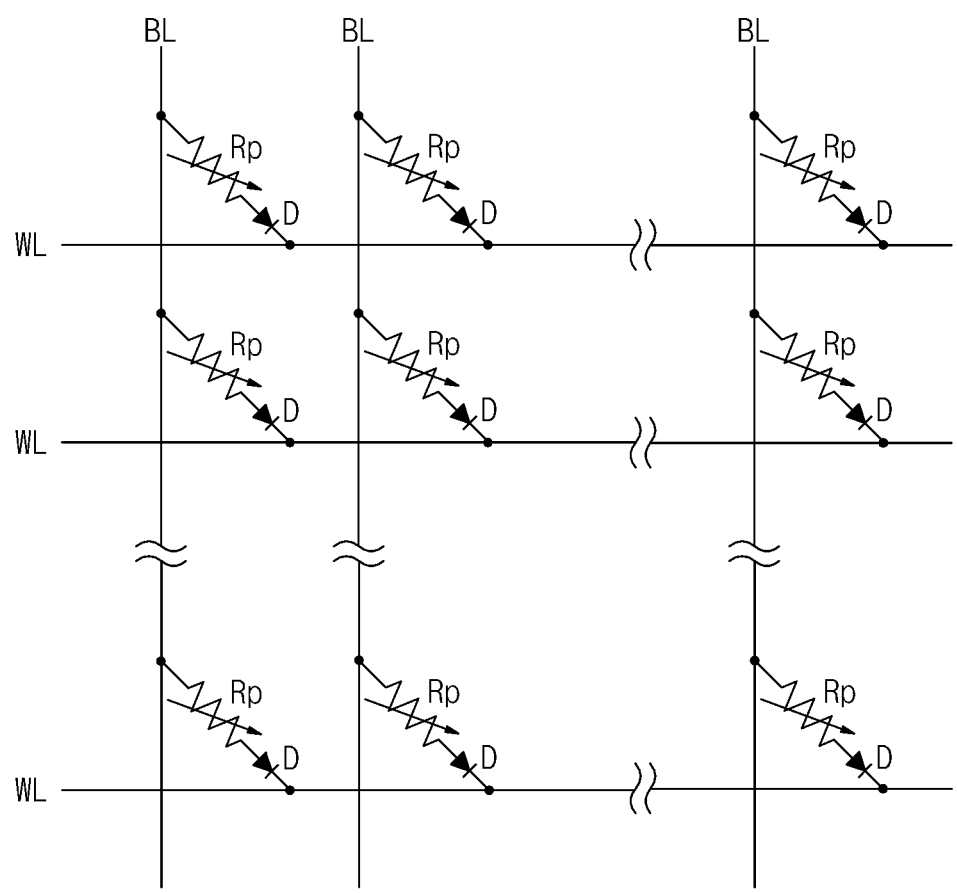
FIG. 1 is a circuit diagram of a phase change memory device.

Embodiments of the present inventive concept will now be described in detail with reference to the accompanying drawings. Note, like reference numbers designate like elements throughout the drawings. Also, in the drawings, the relative size and shape of elements and features, and the thicknesses of layers and regions may be exaggerated for clarity. Also, for the sake of simplifying the written description, reference may be made to one element or feature even though several of such elements or features are formed in practice. Similarly, for the sake of simplifying the drawings, reference may be made to several elements or features being formed even though only one such element or feature is shown in the drawings.

Figure 2:
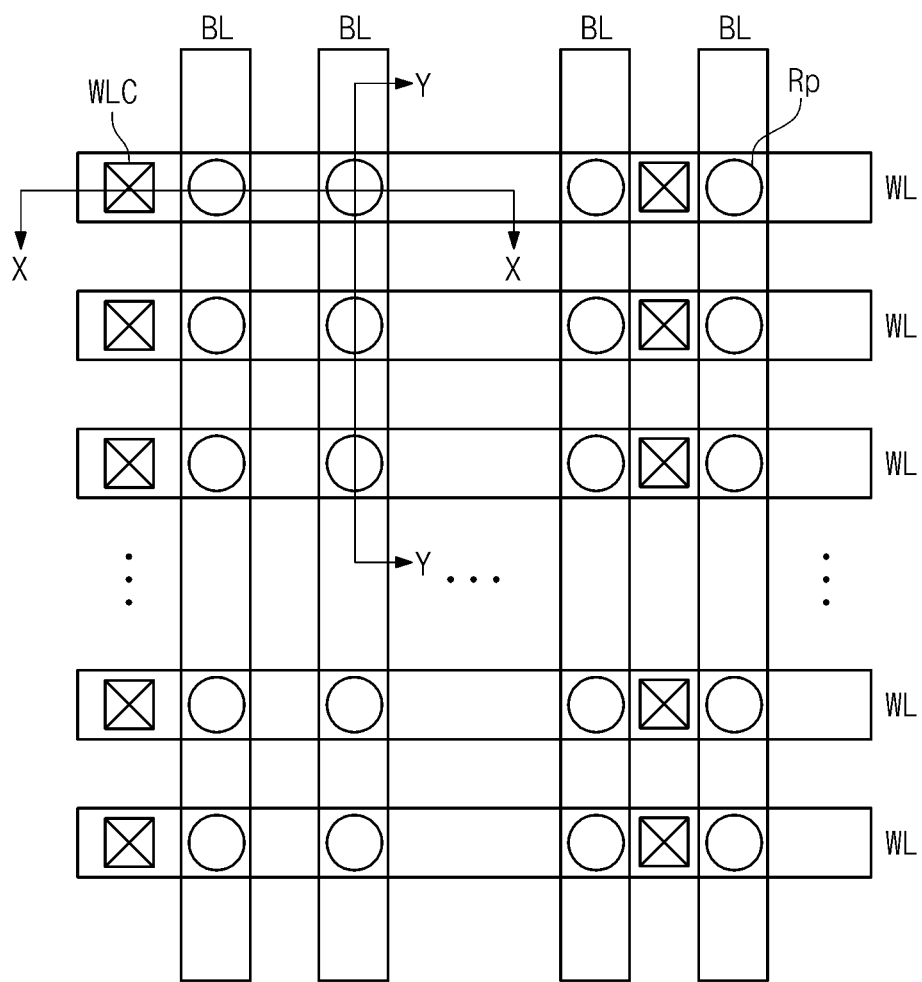
FIG. 2 is a plan view of a layout of a memory cell array region of a phase change memory device having the equivalent circuitry shown in FIG. 1.

Referring to FIGS. 1 and 2, a phase change memory device 100 which can be manufactured according to the inventive concept comprises a plurality of bit lines BL extending in one direction, a plurality of word lines WL intersecting the bit lines BL, and a plurality of memory cells each coupled between a respective one of the word lines WL and a respective one of the bit lines BL. Each memory cell includes a variable resistor Rp as a memory element. The variable resistor Rp comprises phase change material that has both a crystalline phase and an amorphous phase. The value of the resistance of the phase change material, i.e., the logic state of the memory cell, depends on whether the material is in its crystalline phase or amorphous phase.

One end of the variable resistor Rp is connected to a bit line BL, and the other end of the variable resistor Rp is connected to a word line WL. The memory cells may also have diodes or transistors coupled to the variable resistors Rp as means to select the variable resistors Rp whose logic states are to be read. In the illustrated memory device, a diode D is used as the selection device.

Figure 3:
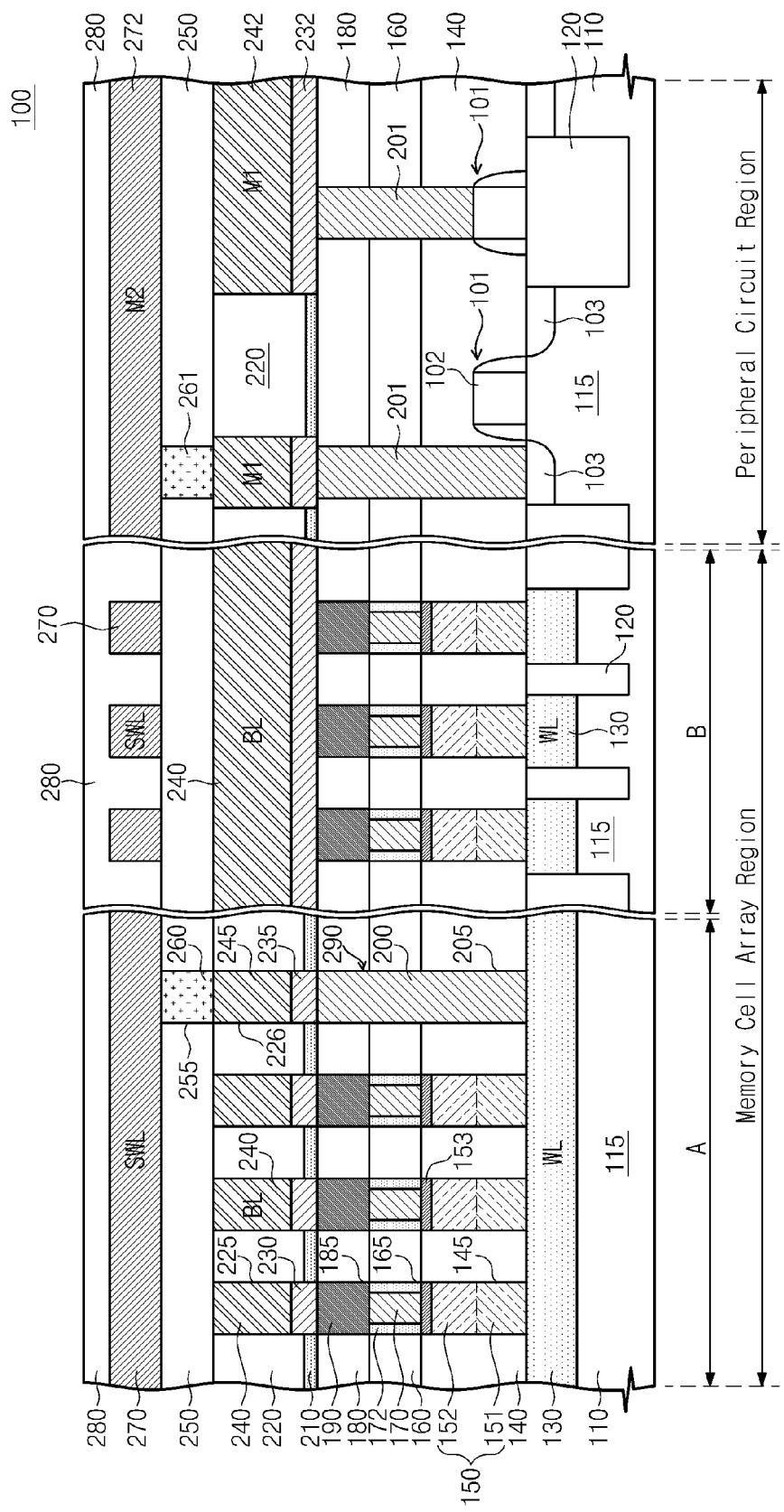
FIG. 3 is a cross-sectional view of a phase change memory device.

FIG. 3 illustrates a phase change memory device which includes a memory cell array region comprising circuitry of the type described above with reference to FIGS. 1 and 2, and a peripheral circuit region. FIG. 3 shows both a cross section of the memory cell array region as taken in the direction the word lines WL and a cross section of the memory cell array region as taken in the direction of the bit lines BL. Specifically, portion A of FIG. 3 illustrates a cross section of the memory cell array region taken along line X-X of FIG. 2 (i.e., a cross section taken along the direction of word lines), and portion B of FIG. 3 illustrates a cross section of the memory cell array region taken along line Y-Y of FIG. 2 (i.e., a cross section taken along the direction of bit lines).

Referring now to FIG. 3, the word lines 130 (WL) are disposed at an upper surface of a semiconductor substrate 110 in the memory cell array region. Adjacent word lines 130 are electrically insulated from each other by a device isolation layer 120. The word lines 130 may be regions of an upper layer of the substrate doped with impurities, respectively. Alternatively, the word lines 130 may be lines of metallic material disposed on the substrate 110. The bit lines 240 (BL) are also disposed on the semiconductor substrate 110 in the memory cell array region, and cross over the word lines 130. The bit lines 240 may be lines of metallic material.

Furthermore, a phase change material layer 190 of discrete segments of phase change material is interposed between the word lines 130 and the bit lines 240. The segments of the phase change material layer 190 correspond to the variable resistors Rp of FIGS. 1 and 2. The phase change material layer 190 may be of a chalcogenide material that includes, for example, Ge, Te and Sb.

Bottom electrodes 170 are interposed between the phase change material layer 190 and the word lines 130, and top electrodes 230 are interposed between the phase change material layer 190 and the bit lines 240. The bottom and top electrodes 170 and 230 are of TiN or TiAlN, for example. Thus, each bottom electrode 170, top electrode 230 and segment of the phase change material interposed therebetween constitutes a resistive memory cell coupled between a word line 130 and a bit line 240.

A respective selection device 150, such as a diode, is interposed between a word line 130 and the bottom electrode 170 of each of the resistive memory cells. Thus, each of the bottom electrodes 170 is electrically connected to a word line 130 through a respective selection device 150. Accordingly, the bottom electrodes 170 may be used as heaters to selectively heat the segments of the phase change material layer 190, i.e., to change the resistance of the segments and hence, the logic state, of the resistive memory cells. Also, as can be seen from portion B of FIG. 3, each of the top electrodes 230 is connected to a plurality of the segments of the phase change material layer 190 spaced along the direction of, i.e., juxtaposed with, a bit line 240. As can be seen from the portion A of FIG. 3, the top electrodes 230 are respectively connected to segments of the phase change material layer 190 spaced along the direction of, i.e., juxtaposed with, a word line 130.

Each diode 150 includes an n-type semiconductor layer 151 and a p-type semiconductor layer 152 on the semiconductor substrate 110. The p-type semiconductor layer 152 is adjacent the bottom electrode 170 and the n-type semiconductor layer 151 is adjacent to the word line 130. Each of the diodes 150 may also have a silicide layer 153 between the p-type semiconductor layer 152 thereof and the bottom electrode 170 to reduce contact resistance.

Furthermore, strapping word lines 270 (SWL) are disposed on the substrate 110 over the bit lines 240 in the memory cell array region. Each strapping word line 270 is electrically connected to a word line 130 through a word line contact 290, and several strapping lines 270 are connected to each word line 130. The strapping word line 270 can reduce resistance of the word line 130. At least one memory cell, for example, 32 memory cells, is provided between adjacent word line contacts 290 connected to a word line 130.

Each word line contact 290 may comprise a plurality of metal studs. In the embodiment shown in FIG. 3, i.e., as one example, the strapping word line contact 290 includes a bottom metal stud 200, an intermediate metal stud 235 on the bottom metal stud 200, and a top metal stud 245 on the intermediate metal stud 235. Also, in this embodiment, each word line contact 290 is electrically connected to a strapping word line 270 through a first via 260.

In the peripheral circuit region, a driving device is disposed on an active region 115 defined by the device isolation layer 120. The driving device is configured to drive the circuitry of the memory cell array region. To this end, the driving device includes drive transistors 101. Furthermore, first metal lines 242 (M1) are each electrically connected to a gate 102 of a drive transistor 101 and/or to a source/drain 103 through a metal contact 201. The first metal lines 242 (M1) may be disposed at the same level as the bit lines 240 in the memory cell array region. A metal barrier layer 232 is interposed between the first metal line 242 and the metal contact 201. The metal barrier layer 232 may be disposed at the same level as the top electrodes 230 in the memory cell array region. Second metal lines 272 (M2) are provided on the substrate 110 over first metal lines 242. The second metal lines 272 may be disposed at the same level as the strapping word lines 270. Each second metal line 272 is electrically connected to a first metal line 242 through a second via 261.

The phase change memory device 100 also has insulation layers in which the various conducting elements of the device are disposed. For convenience of explanation, an insulation layer in which the diodes 150 are disposed will be referred to as a first insulation layer 140, an insulation layer in which the bottom electrodes 170 are disposed will be referred to as a second insulation layer 160, and an insulation layer in which the phase change material layer 190 is disposed will be referred to as a third insulation layer 180. Similarly, an insulation layer in which the top electrodes 230, the bit lines 240 and the first metal lines 242 are disposed will be referred to as a fourth insulation layer 220, an insulation layer in which the first and second vias 260 and 261 are disposed will be referred to as a fifth insulation layer 250, and an insulation layer in which the strapping word lines 270 and the second metal lines 272 are disposed will be referred to as a sixth insulation layer 280.

In the memory cell array region, the diodes 150 are situated in first contact holes 145 which extend through the first insulation layer 140 to the word lines 130. Similarly, the bottom electrodes 170 are situated in second contact holes 165 which extend through the second insulation layer 160 to the diodes 150, and the segments of phase change material layer 190 are situated in third contact holes 185 which extend through the third insulation layer 180 to the bottom electrodes 170. Thus, at least the memory cell array of the phase change memory device 100 has a highly integrated structure. This confined structure may also help to minimize the level of program current needed to change the phase of the phase change material layer 190 (between crystalline and amorphous). Furthermore, insulation spacers 172 may be provided on sides of the second contact holes 165 to reduce the area of contact between the bottom electrodes 170 and the phase change material layer 190, thereby helping to further minimize the level of program current.

FIGS. 4A through 4J illustrate an embodiment of a method of manufacturing the phase change memory device 100 according to the inventive concept. Similarly to FIG. 3, portion A of each of FIGS. 4A through 4J shows a cross section of an intermediate or final product taken in the direction of line X-X of FIG. 2, and portion B shows a cross section taken in the direction of line Y-Y of FIG. 2.

Figure 4A:
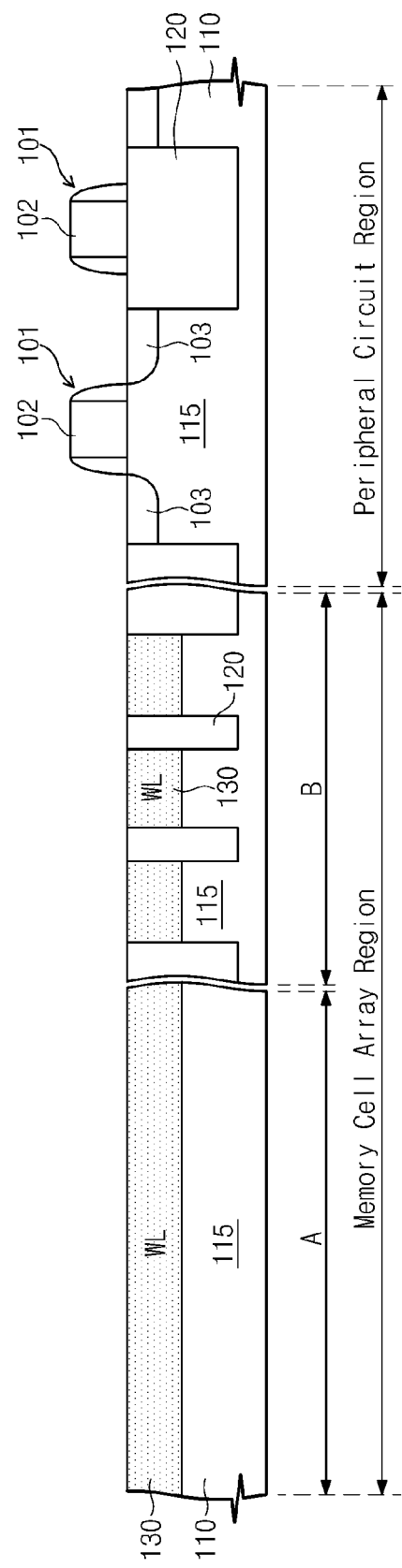
FIGS. 4A through 4J are each a cross-sectional view of a substrate and together illustrate an embodiment of a method of manufacturing the phase change memory device shown in FIG. 3, according to the inventive concept.

Referring to FIG. 4A, a device isolation layer 120 is formed in a semiconductor substrate 110 to define an active region 115. The semiconductor substrate 110 may be a silicon substrate doped with p-type impurities. The device isolation layer 120 may be formed by a Shallow Trench Isolation (STI) process.

A plurality of word lines 130 are formed on the semiconductor substrate 110 in the memory cell array region. The word lines 130 may be formed by doping the active region 115 of the semiconductor substrate 110. For example, the word lines 130 are formed by doping the active region with n-type impurities when the semiconductor substrate 110 is a p-type silicon substrate. The word lines 130, however, may be formed by other techniques. As one example, the word lines 130 may be formed by forming an epitaxial semiconductor layer on the semiconductor substrate 110 and doping the epitaxial semiconductor layer after or during its formation. As another example, the word line 130 may be formed by depositing a metallic film on the substrate 100 and then patterning the film.

Drive transistors 101 are formed on the semiconductor substrate 110 in the peripheral circuit region. The drive transistors 101 may be formed by forming a layer of doped silicon or metal on the substrate 110 using a deposition process, patterning the layer to form gates 102, and then doping the active region 115 to form source/drains 103. The drive transistors 101 may be formed before or after the word lines 130 are formed.

Figure 4B:
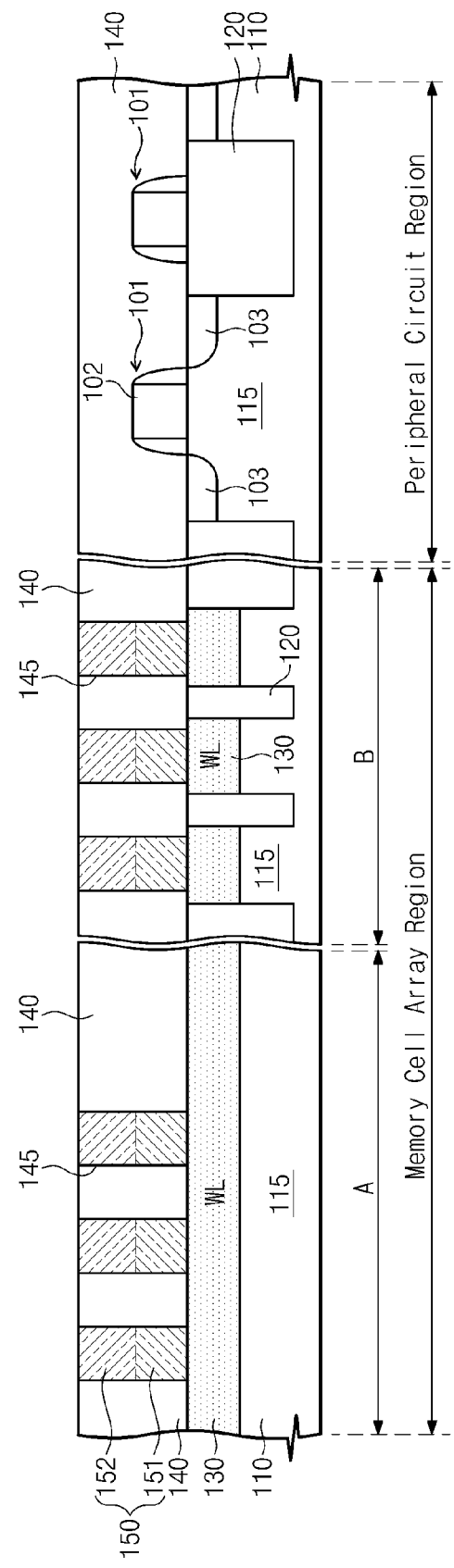

Referring to FIG. 4B, a first insulation layer 140 is formed by depositing an insulation material, e.g., $SiO_2$, on the semiconductor substrate 110. The first insulation layer 140 in the memory cell array region is patterned to form a plurality of first contact holes 145 which expose the word lines 130. Diodes 150, or other kinds of selection devices, are formed within the first contact holes 145, respectively. The diodes 150 are formed, for example, by sequentially forming first and second layers of such material as germanium, silicon or silicon-germanium within the first contact holes 145, and doping the first and second layers with p-type and n-type impurities, respectively, to form p-type and n-type semiconductor layers 151 and 152. The layers may be formed in the first contact holes 145 by a selective epitaxial growth or a solid-phase epitaxial growth process. The selective epitaxial growth process entails growing an epitaxial layer within the first contact holes 145 using a seed layer. The solid-phase epitaxial growth entails forming an amorphous silicon layer or a polycrystalline silicon layer within the first contact holes 145 and crystallizing the amorphous silicon layer or polycrystalline silicon layer. In the present embodiment, the diodes 150 are formed by a selective epitaxial growth process.

Figure 4C:
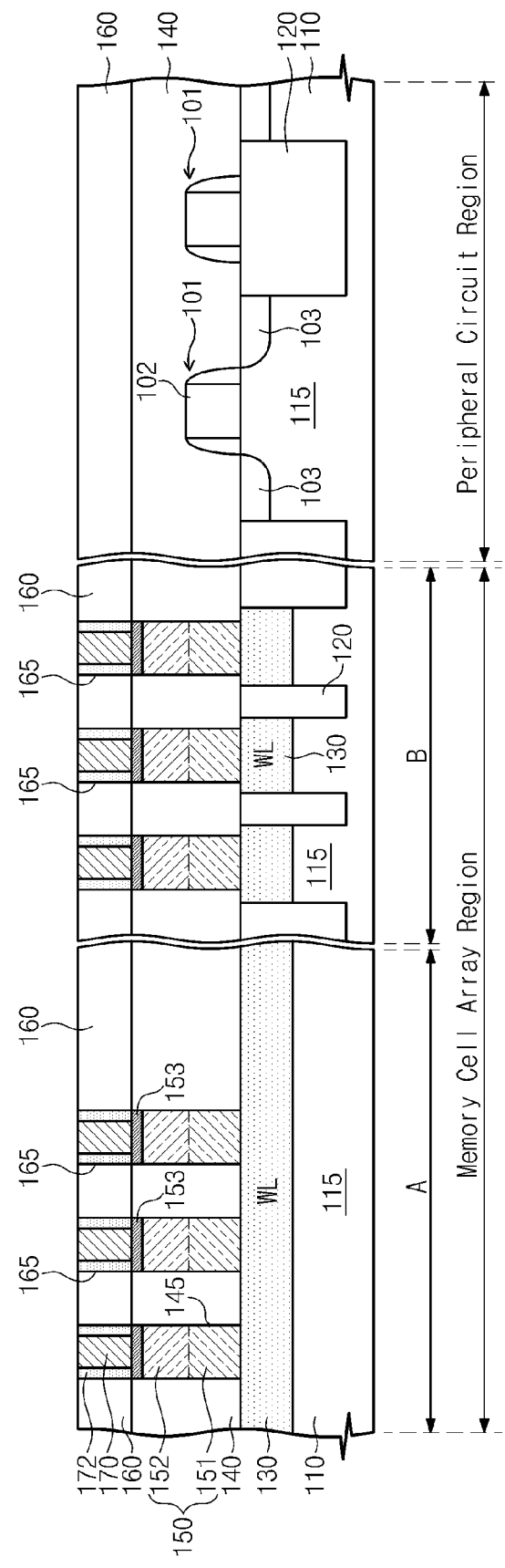

Referring to FIG. 4C, a silicide layer 153 may be formed on the diodes 150. The silicide layer 153 may be a metal silicide, for example, cobalt silicide, nickel silicide or titanium silicide.

Next, a second insulation layer 160 is formed by depositing an insulation material, e.g., $SiO_2$, on the first insulation layer 140. The second insulation layer 160 is then patterned in the memory cell array region to form a plurality of second contact holes 165 which expose the diodes 150.

Insulation spacers 172 may be formed on inner sidewalls of the second insulation layer 160 which define the second contact holes 165. The insulation spacers 172 may be formed by depositing silicon oxide ($SiO_2$), silicon oxynitride (SiON), or a silicon nitride (e.g., SiN or $Si_3N_4$) on the inner sidewalls of the second insulation layer 160.

Bottom electrodes 170 are then formed within the second contact holes 165, respectively. The bottom electrodes 170 may be formed by forming a film of metallic material on the second insulation layer 160 to such a thickness as to fill the second contact holes 165, and then planarizing the metallic film using a chemical mechanical polishing or an etch back process. Note, the bottom electrodes 170 are fabricated of metallic material which will not interact with the phase change material layer (190 of FIG. 3). The metallic material may be at least one material selected from the group consisting of TiN, TiAlN, TaN, WN, MoN, NbN, TiSiN, TiBN, ZrSiN, WSiN, WBN, ZrAlN, MoAlN, TaSiN, TaAlN, TiW, TiAl, TiON, TiAlON, WON, and TaON.

The bottom electrodes 170 may be used as heaters to heat the discrete segments of the phase change material layer 190, as described above with reference to FIG. 3. The relatively small areas of contact between the phase change material layer 190 and the bottom electrodes 170 help to minimize the level of current needed to heat the phase change material layer 190 to the extent required to alter its phase. That is, only a relatively small level of programming current is necessary. The insulation spacers 172 serve to even further reduce the area contact between the phase change material layer 190 and the bottom electrodes 170 and thereby further minimize the level of programming current required. The silicide layer 153 formed on the diodes 150 serves to reduce the contact resistance between the diodes 150 and the bottom electrodes 170.

Figure 4D:
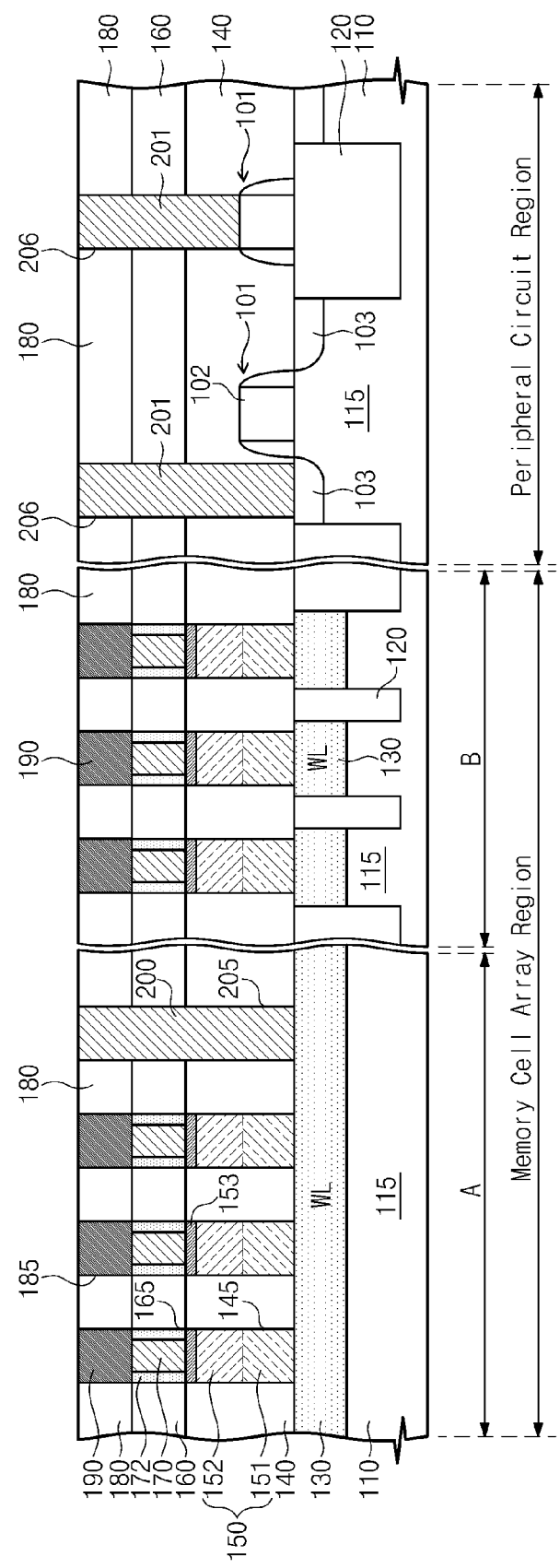

Referring to FIG. 4D, a third insulation layer 180 is formed by depositing an insulation material, e.g., $SiO_2$, on the second insulation layer 160. The third insulation layer 180 is patterned in the memory cell array region to form a plurality of third contact holes 185 which expose the bottom electrodes 170 (as well as the insulation spacers 172 surrounding the electrodes 170), respectively. A phase change material layer 190 is formed within the third contact holes 185.

As mentioned above, the phase change material layer 190 is formed of material that can assume both an amorphous state in which the material exhibits a high resistance and a crystalline state in which the material exhibits low resistance. In this respect, the phase changeable material may include at least one material selected from the group consisting of Te, Se, Ge, Sb, Bi, Pb, Sn, As, S, Si, P, and O. More specifically, the phase change material layer 190 may be formed of a chalcogenide material including elements selected from the group consisting of Ge—Sb—Te (GST), Ge—Bi—Te (GBT), As—Sb—Te, As—Ge—Sb—Te, Sn—Sb—Te, In—Sn—Sb—Te, Ag—In—Sb—Te, 5A element-Sb—Te, 6A element-Sb—Te, 5A element-Sb—Se, and 6A element-Sb—Se. Furthermore, the chalcogenide material may also be doped with impurities, for example, N, O, Si and combinations thereof. In any case, the state or so-called phase of the phase change material can be changed from amorphous to crystalline and vice versa by heating the material to a certain temperature and/or for a certain period of time.

The first to third insulation layers 140, 160 and 180 are then patterned in the memory cell array region to form bottom word line contact holes 205 (only one of which is shown) which expose the word lines 130. Bottom metal studs 200 are then formed by filling the bottom word line contact holes 205 with metallic material. Alternatively, these processes may be carried out before the phase change material layer 190 is formed.

Likewise, the first to third insulation layers 140, 160 and 180 are patterned in the peripheral circuit region to form first peripheral contact holes 206 which expose the source/drains 103 and/or the gates 102, respectively. The first peripheral contact holes 206 may be formed simultaneously with the bottom word line contact holes 205. Metal contacts 201 are then formed by depositing metallic material within the first peripheral contact holes 206. The metal contacts 201 may be formed simultaneously with the bottom metal studs 200.

The first to third contact holes 145, 165 and 185 may be formed by various methods. As one example, the first to third insulation layers 140, 160 and 180 are patterned using a single etching process to form the first to third contact holes 145, 165 and 185 at essentially the same time. Alternatively, the sets of first to third contact holes 145, 165 and 185 may be formed in succession by different etching processes, i.e., the third contact holes 185 are formed by etching the third insulation layer 180, the second contact holes 165 are then formed by etching the second insulation layer 160 using a process different from that used to form the third contact holes, and then the first contact holes 145 are formed by etching the first insulation layer 140 using a process different from those used to form the second and third contact holes. As another example, the third contact holes 185 are formed by etching the third insulation layer 180, and then the first and second contact holes 145 and 165 are formed at essentially the same time by patterning the first and second insulation layers 140 and 160 using a single etching process different from that used to form the third contact holes 185. Alternatively, the second and third insulation layers 160 and 180 may be etched using a single etching process to form the second and third contact holes 165 and 185 at essentially the same time, and then the first contact holes 145 are formed by patterning the first insulation layers 140 using an etching process different from that used to form the second and third contact holes 165 and 185.

The bottom word line contact holes 205 and the second contact holes 206 may be formed similarly, i.e., by patterning the first to third insulation layers 140, 160 and 180 at essentially the same time or in succession, by patterning the third insulating layer 180 and then patterning the first and second insulation layers 140 and 160 at essentially the same time, or by patterning the second and third insulation layers 160 and 180 at essentially the same time and then patterning the first insulation layer 140.

Figure 4E:
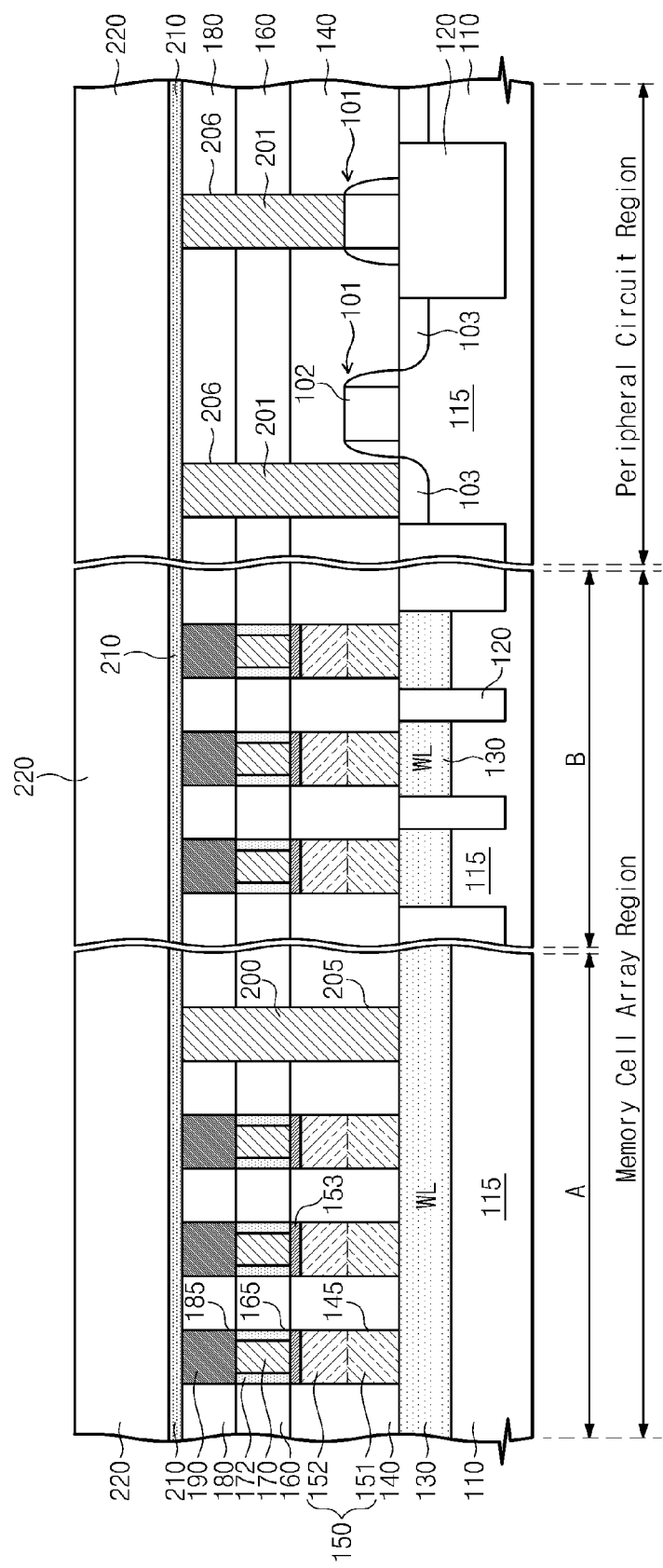

Referring to FIG. 4E, an etch stop layer 210 is formed on the third insulation layer 180. A fourth insulation layer 220 is then formed by depositing an insulative material, e.g., $SiO_2$, on the third insulation layer 180. The etch stop layer 210 is formed of an insulaton material that has an etch selectivity with respect to the fourth insulation layer 220. For example, the etch stop layer 210 is formed of silicon oxynitride (SiON) or a silicon nitride (e.g., SiN or $Si_3N_4$) when the fourth insulation layer 220 is formed of a silicon oxide (e.g., $SiO_2$).

Figure 4F:
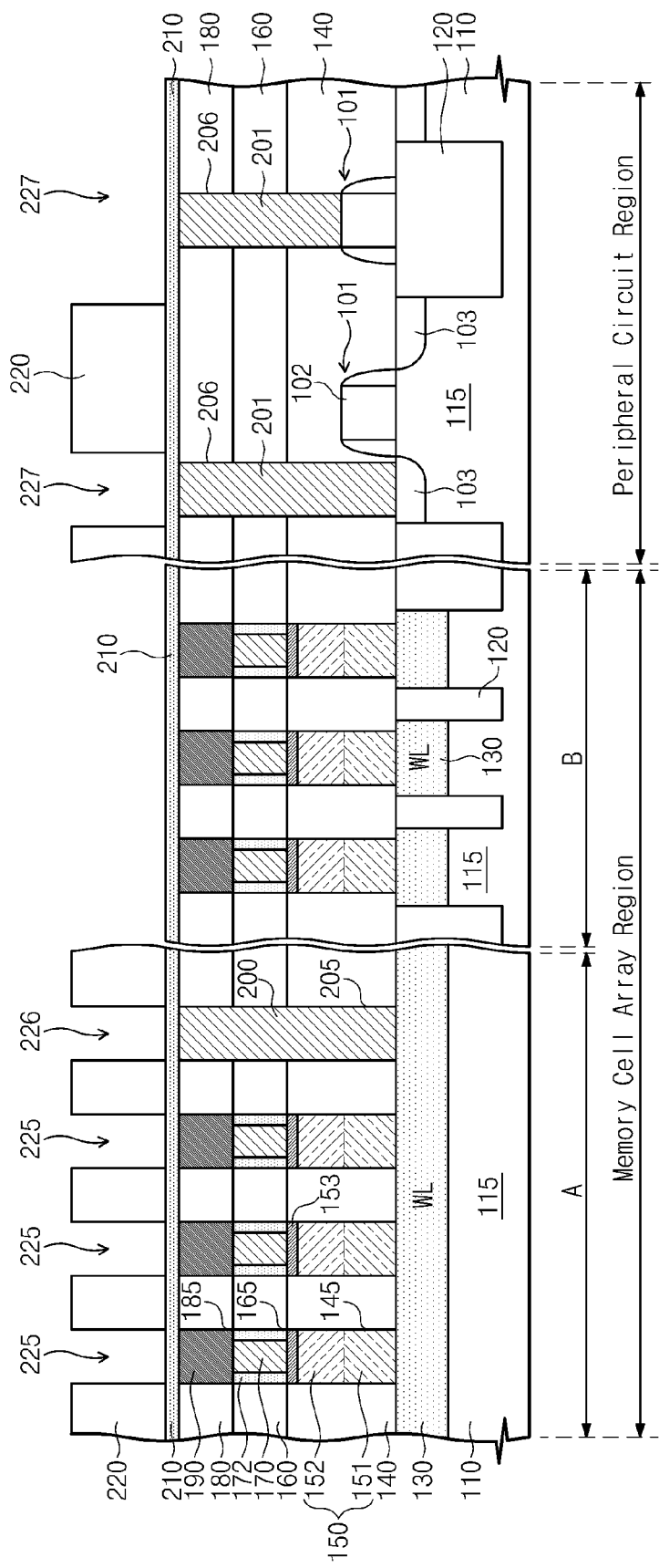

Referring to FIG. 4F, the fourth insulation layer 220 is patterned in the memory cell array region to form a plurality of fourth contact holes 225 which expose the etch stop layer 210. Each of the fourth contact holes 225 is aligned with a discrete segment of the phase change material layer 190 corresponding to the resistors of a resistive memory cell. Top word line contact holes 226 are also formed the fourth insulation layer 220 and thus, may be formed simultaneously with the fourth contact holes 225. The top word line contact holes 226 are aligned with the bottom metal studs 200, respectively.

The fourth insulation layer 220 is also patterned in the peripheral circuit region to form second peripheral contact holes 227 which expose the etch stop layer 210 and are aligned with the metal contacts 201. In this respect, the fourth insulation layer 220 may be patterned in the peripheral circuit region at the same time the fourth insulation layer 220 is patterned in the memory cell array region. That is, the fourth contact holes 225, the top word line contact holes 226 and the second peripheral contact holes 227 may be formed simultaneously by patterning the fourth insulation layer 220.

Figure 4G:
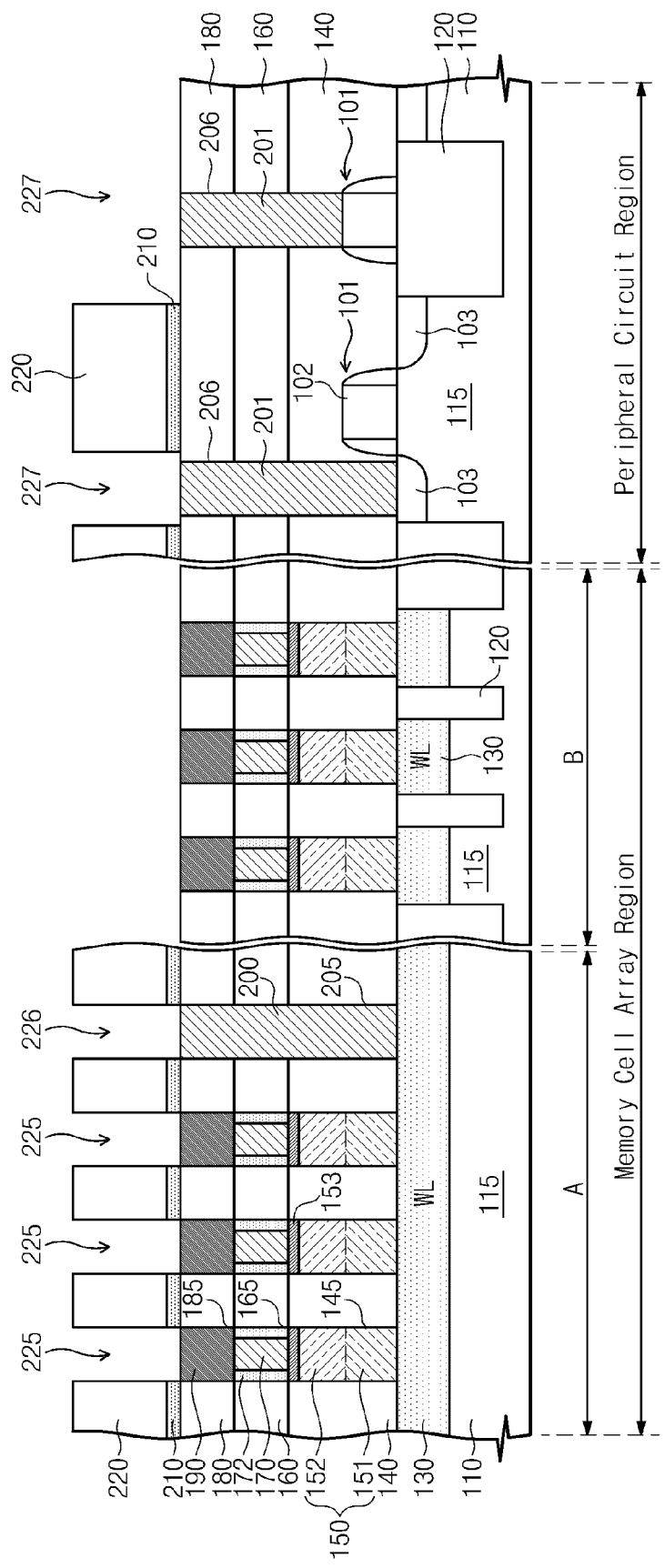

Referring to FIG. 4G, the exposed portions of the etch stop layer 210 are removed by a dry etch or wet etch process. As a result, the phase change material layer 190 is exposed by the fourth contact holes 225, the bottom metal studs 200 are exposed by the top word line contact holes 226, and the metal contacts 201 are exposed by the second peripheral contact holes 227.

Next, a cleaning process may be performed to remove contaminants produced during the etching of the etch stop layer 210. In addition, a surface treatment process may be carried out of the cleaning process. For example, the surface of the phase change material layer 190 exposed by the fourth contact holes 225 may be treated using RF energy. Likewise, the surfaces of the bottom metal studs 200 exposed by the top word line contact holes 226 and the surfaces of the metal contacts 201 exposed by the second peripheral contact holes 227 may be treated using RF energy.

Figure 4H:
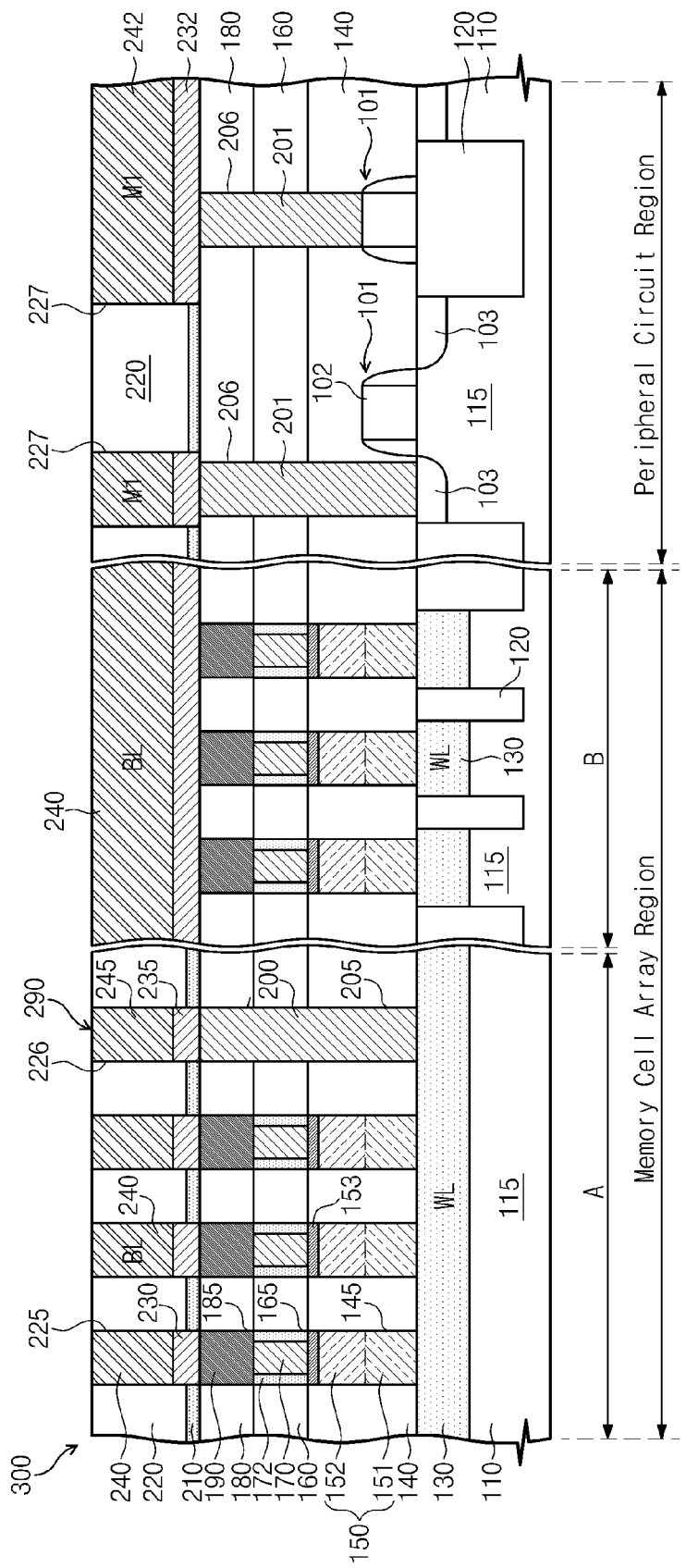

Referring to FIG. 4H, in the memory cell array region, a top electrode 230 and a bit line 240 are successively formed within each of the fourth contact holes 225.

For example, the top electrode 230 is formed in the shape of a plug by depositing metallic material within the fourth contact hole 225 and then removing a portion of the metallic material to leave a recess in the fourth insulation layer 220.

The bit line 240 is then formed by depositing metallic material in the recess and thus on the top electrode 230. The deposition processes may be CVD or PVD processes. According to one example, the top electrodes 230 and the bit lines 240 are formed by sputtering processes.

Alternatively, the top electrode 230 may be formed by only performing a deposition process to form a metallic film in the lower part of the fourth contact hole 225, and then the bit line 240 is formed by performing a deposition process to fill the remaining upper part of the fourth contact hole 225 with metallic material.

The top electrodes 230 are formed from a metallic material that will not interact with the phase change material layer 190. Preferably, the material is similar, i.e., the same or nearly the same, as that of the bottom electrodes 230. The bit lines 240 may be formed of at least one conductive material different from that of the electrodes and selected from of the group consisting of Ti, W, Si, Cu, Ta, Mo, Ru, Al, Au, Pt, Ag and alloys thereof In any case, according to an aspect of the inventive concept, the top electrodes 230 and the bit lines 240 are formed within the fourth contact holes 225. Thus, the fourth insulation layer 220 having the fourth contact holes 225 extending therethrough constitutes a damascene pattern 300. That is, the top electrodes 230 and the bit lines 240 are formed by a damascene process. Accordingly, the bit lines 240 are self-aligned with the top electrodes 230. Thus, top electrode contacts are not required to provide a process margin between the bit lines and the top electrodes. Furthermore, the number of photolithography processes are minimized, i.e., the above-described embodiment of the inventive concept does not employ one photolithography process for the forming of the top electrodes on the phase change material layer and another photolithography process for the forming of the bit lines.

Still referring to FIG. 4H, an intermediate metal stud 235 and a top metal stud 245 are formed within each top word line contact hole 226 in the memory cell array region. Thus, the top metal studs 245 are self-aligned with the intermediate metal studs 235 using a damascene process. The studs 235 and 245 may be formed before, after, or as the top electrodes 230 and bit lines 240 are formed. Preferably, the intermediate metal studs 235 are formed simultaneously with the top electrodes 230, and the top metal studs 245 are formed simultaneously with the bit lines 240. Also, the intermediate metal studs 235 may be formed of material similar to that of the top electrodes 230. The bottom metal stud 200, the intermediate metal stud 235 and the top metal stud 245 constitute a word line contact 290 electrically connected to a word line 130.

In the peripheral circuit region, a metal barrier layer 232 and a first metal line 242 are successively formed within each second peripheral contact hole 227. The metal barrier layer 232 and the first metal lines 242 may be formed before, after or as the top electrodes 230 and bit lines 240 are formed. Preferably, the metal barrier layer 232 is formed simultaneously with the top electrodes 230, and the first metal lines 242 are formed simultaneously with the bit lines 240, whereby the metal barrier layer 232 is formed of the same material as the top electrodes 230, and the first metal lines 242 are formed of the same material as the bit lines 240. In any case, the first metal lines 242 are thus self-aligned with the metal barrier layer 232 using a damascene process.

Figure 4I:
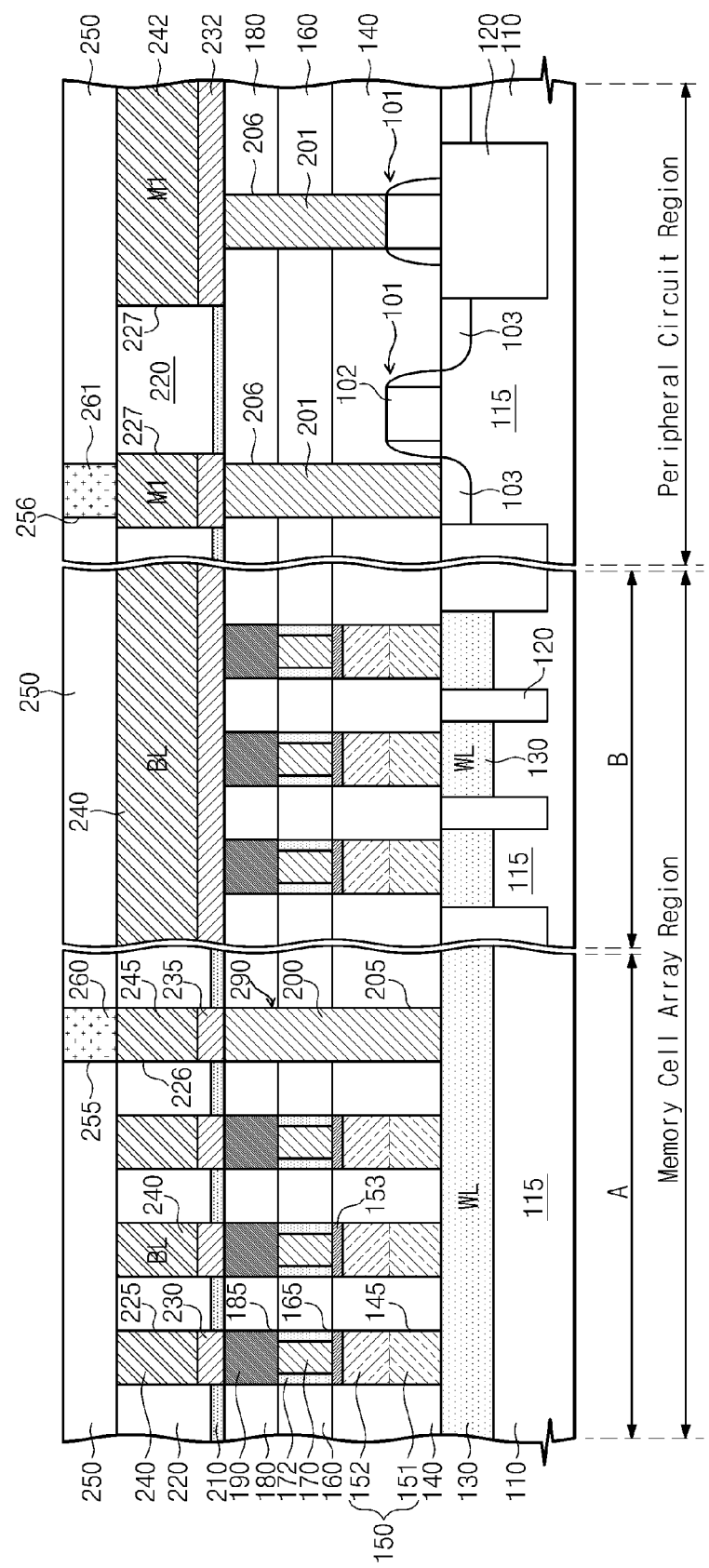

Referring to FIG. 4I, a fifth insulation layer 250 is formed on the fourth insulation layer 220 by depositing an insulation material, e.g., $SiO_2$, on the fourth insulation layer 220. The fifth insulation layer 250 is patterned in the memory cell array region to form a first via hole 255 which exposes the word line contact 290. The first via hole 255 is filled with metallic material to form a first via 260 connected to the word line contact 290. The fifth insulation layer 250 is also patterned in the peripheral circuit region to form a second via hole 256 which exposes the first metal line 242. Then, the second via hole 256 is filled with metallic material to form a second via 261 connected to the first metal line 242. The second via 261 may be formed simultaneously with the first via 260.

In this respect, the fifth insulation layer 255 may be patterned in the peripheral circuit region and in the memory cell region at the same time. That is, the first via hole 255 may be formed in the memory cell array region and the second via hole 256 may be formed in the peripheral circuit region at the same time. Thus, the processes of forming vias 260 and 261 in the memory cell region and the peripheral circuit region is relatively easy to carry out because the etching targets for forming the via holes 255 and 256 are the same and because the step coverage required in the memory cell array region and peripheral circuit region is the same.

Figure 4J:
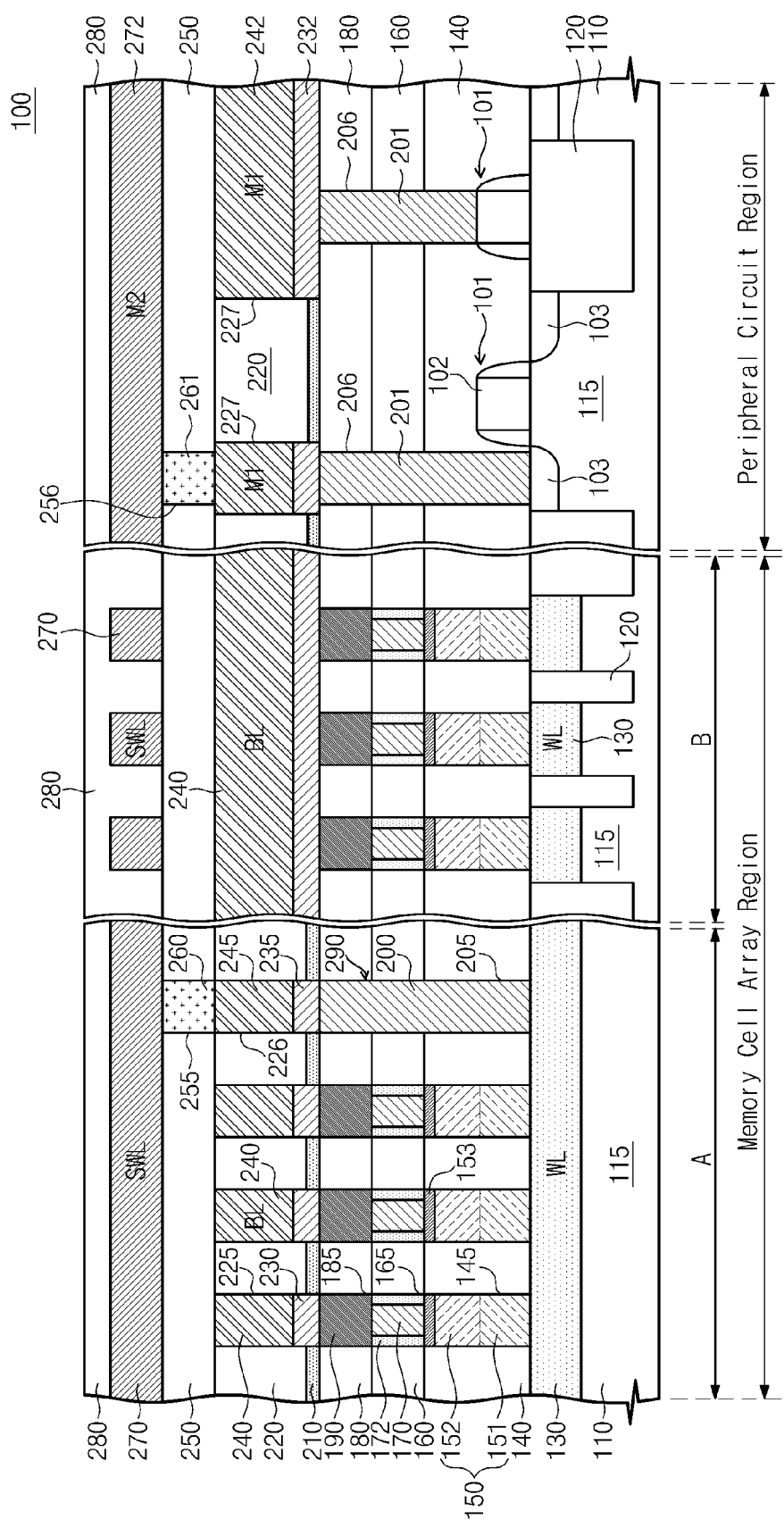

Referring to FIG. 4J, a strapping word line 270 connected to the first via 260 is formed in the memory cell array region, and a second metal line 272 connected to the second via 261 is formed in the peripheral circuit, by depositing metallic material on the fifth insulation layer 250. A sixth insulation layer 280 is then formed on the fifth insulation layer 250 to such a thickness as to cover the strapping word line 270 and the second metal line 272. The phase change memory device 100 is thus completed.

Figure 5A:
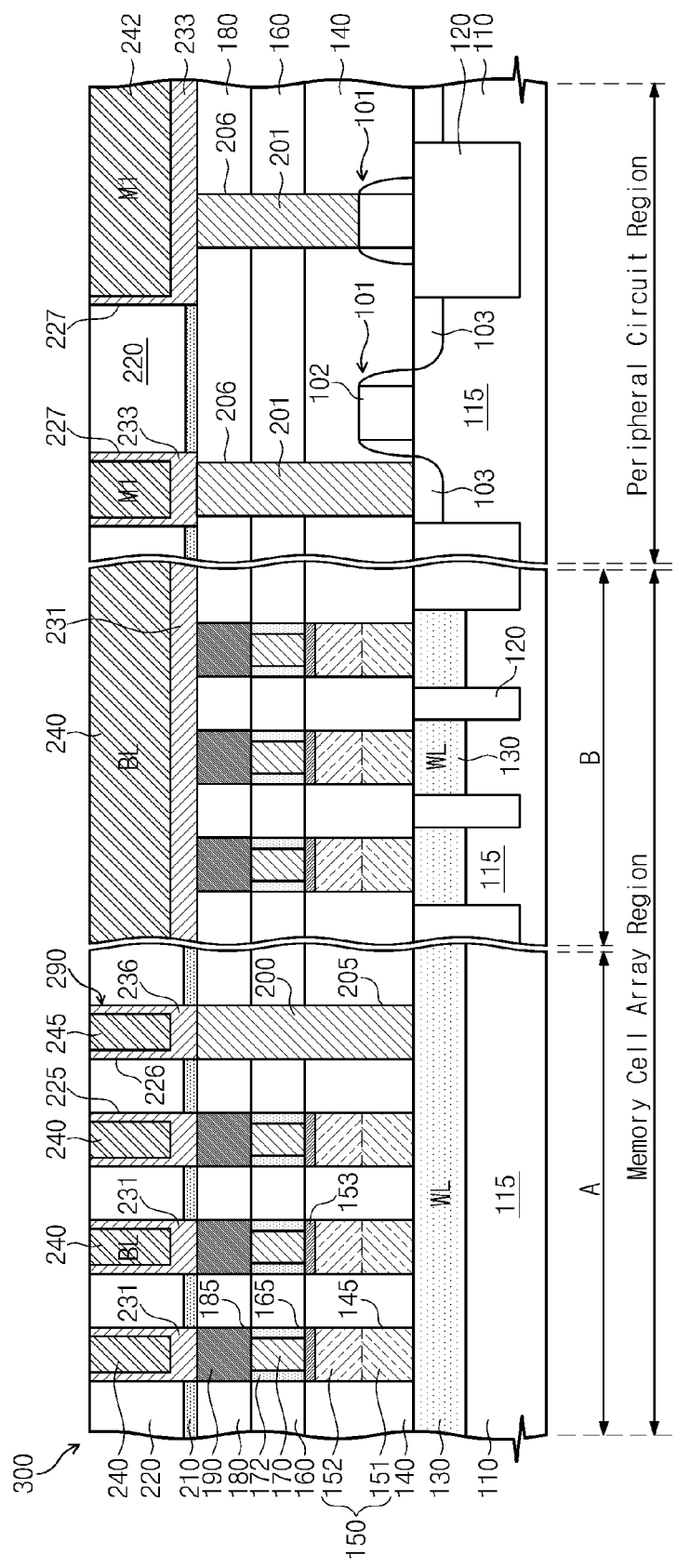
FIGS. 5A and 5B are each a cross-sectional view of a substrate and illustrate steps in another embodiment of a method of manufacturing a phase change memory device according to the inventive concept.
Figure 5B:
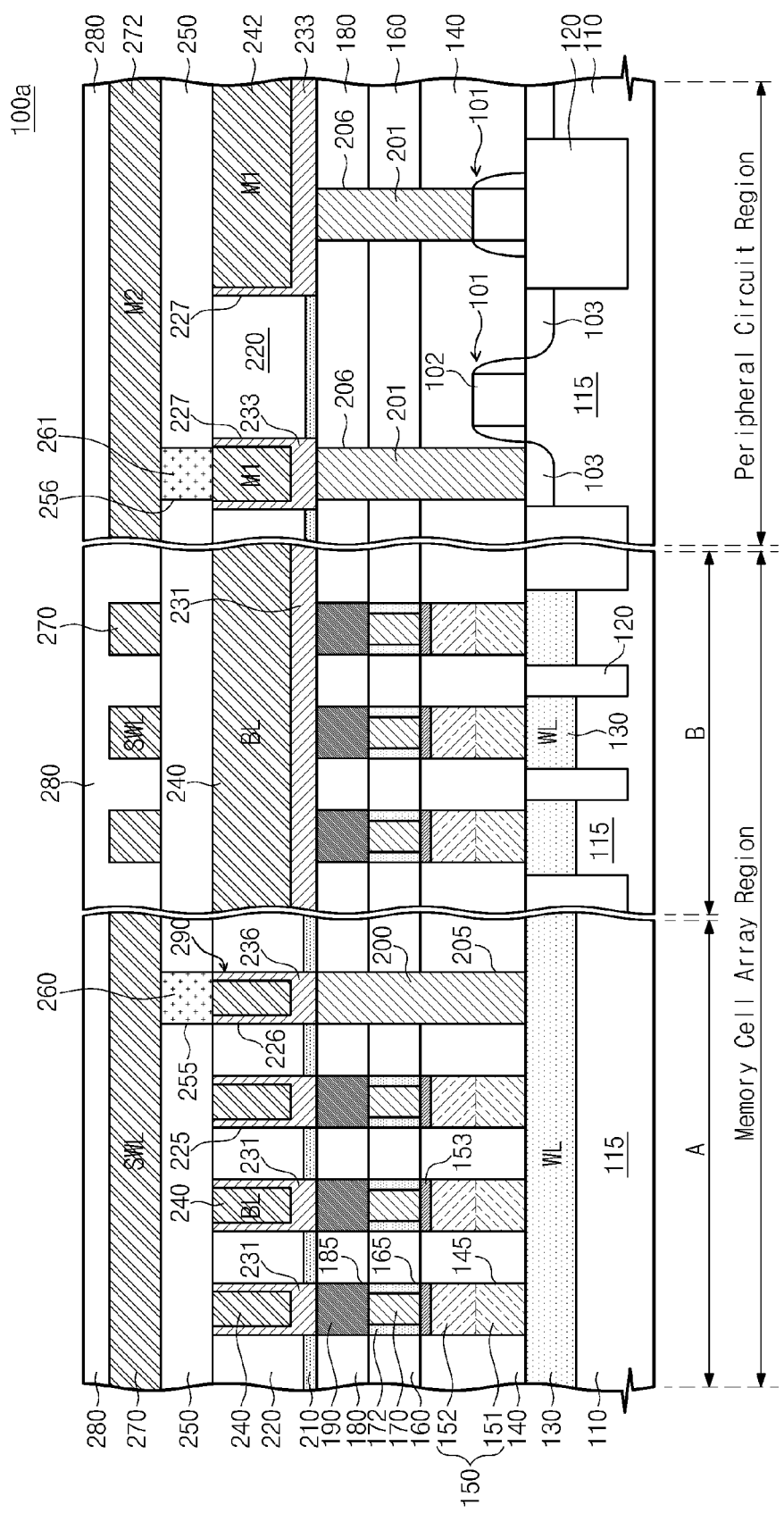

FIGS. 5A and 5B illustrate steps in another embodiment of a method of manufacturing a phase change memory device according to the inventive concept. This embodiment is essentially the same as that described above up to the step shown in and described with respect FIG. 4G.

That is, word lines 130, diodes 150, bottom electrodes 170 and a phase change material layer 190 are formed on a semiconductor substrate 110 in the memory cell array region in a manner similar to that described with reference to FIGS. 4A to 4G. Also, first, second and third insulation layers 140, 160 and 180 are patterned in the memory cell array region to form bottom word line contact holes 205, and each bottom word line contact hole 205 is filled with metallic material to form a bottom metal stud 200 connected to a word line 130. Likewise, the first, second and third insulation layers 140, 160 and 180 are patterned in the peripheral circuit region to form first peripheral contact holes 206, and each first peripheral contact hole 206 is filled with metallic material to form a metal contact 201 connected to a drive transistor 101.

An etch stop layer 210 and a fourth insulation layer 220 are formed on the third insulation layer 180. The fourth insulation layer 220 is patterned in the memory cell array region to form fourth contact holes 225 and top word line contact holes 226. Furthermore, the fourth insulation layer 220 is patterned in the peripheral circuit region to form second peripheral contact holes 227.

In the memory cell array region, portions of the etch stopper 210 exposed by the fourth contact holes 225 and the top word line contact holes 226 are removed. Similarly, in the peripheral circuit region, portions of the etch stopper 210 exposed by the second peripheral contact holes 227 are removed. A cleaning process and a surface treatment using RF energy may then be performed.

As a result, a damascene pattern 300 is formed on the third insulation layer 180.

Now, referring to FIG. 5A, metallic material is deposited at the bottom and along the sides of the fourth contact holes 225 to form top electrodes 231. Therefore, the top electrodes 231 may each have the shape of a box. Also, by virtue of the deposition technique employed, the resulting metallic film formed at the bottom of the fourth contact hole 225 will be thicker than the metallic film formed along the sides of the fourth contact hole 225. Similarly, metallic material is deposited at the bottom and along the sides of the top word line contact holes 226 to form intermediate metal studs 236, and at the bottom and along the sides of the second peripheral contact hole 227 to form barrier metal layers 233. Thus, the intermediate metal studs 236 and the metal barrier layers 233 each also have the shape of a box.

The top electrodes 231 are filled with metallic material to form bit lines 240, respectively. The bit lines 240 are thus self-aligned with the top electrodes 231. The intermediate metal studs 236 are also filled with metallic material to form top metal studs 245. A bottom metal stud 200, intermediate metal stud 236 and top metal stud 245 constitute a word line contact 290 connected to the word line 130. In the peripheral circuit region, the metal barrier layers 233 are filled with metallic material to form first metal lines 242. The first metal lines 242 are thus self-aligned with the metal barrier layers 233.

Referring to FIG. 5B, processes similar to those described in FIGS. 4I to 4J are performed. That is, a fifth insulation layer 250, first vias 260, second vias 261, strapping word lines 270, second metal lines 272 and a sixth insulation layer 280 are formed on the semiconductor substrate 110.

FIGS. 6A through 6D illustrate steps in still another embodiment of a method of manufacturing a phase change memory device according to the inventive concept. This embodiment is essentially the same as that described above up to the step shown in and described with respect FIG. 4E. Therefore, this part of the method will not be described in detail.

Figure 6A:
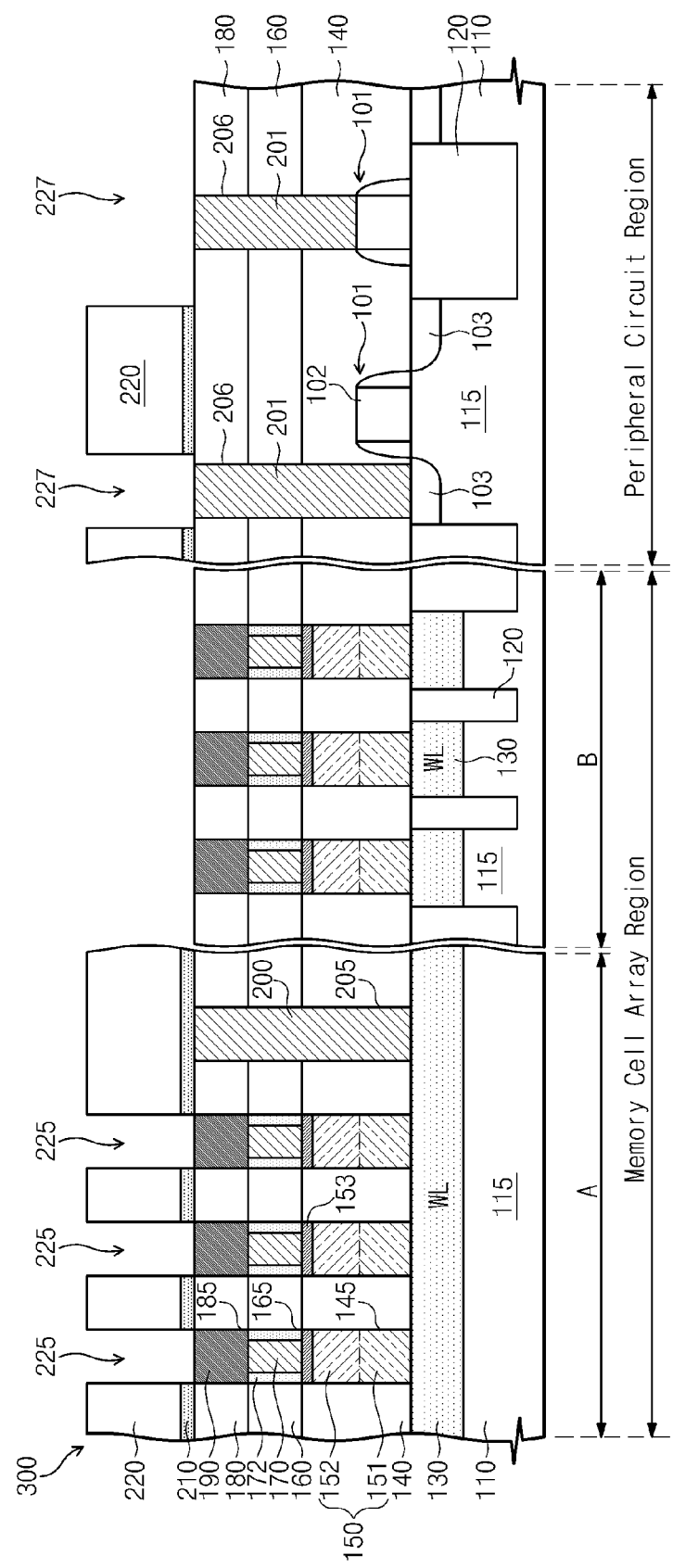

Referring to FIG. 6A, a damascene pattern 300 is formed on the third insulation layer 180. More specifically, the fourth insulation layer 220 is patterned in the memory cell array region to form fourth contact holes 225. At the same time, the fourth insulation layer 220 is patterned in the peripheral circuit region to form second peripheral contact holes 227. In the memory cell array region, portions of the etch stopper 210 exposed by the fourth contact holes 225 are removed. Similarly, in the peripheral circuit region, portions of the etch stopper 210 exposed by the second peripheral contact holes 227 are removed. A cleaning process and a surface treatment using RF energy may then be performed.

Figure 6B:
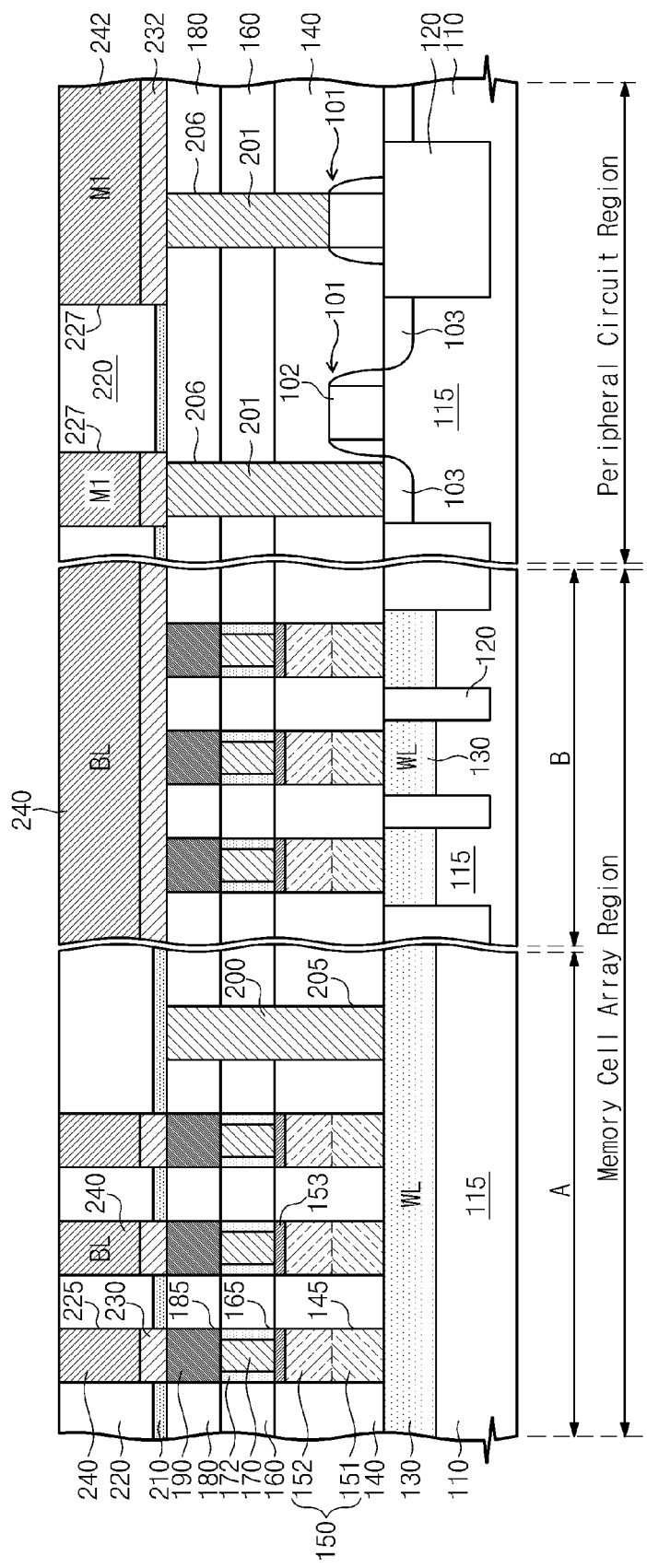

Referring to FIG. 6B, the fourth contact holes 225 are filled with metallic material to form top electrodes 230 and bit lines 240 by a process similar to that described with reference to FIG. 4H. Thus, the bit lines 240 are formed self-aligned with the top electrodes 230. In the peripheral circuit region, the second peripheral contact holes 227 are filled with metallic material to form metal barrier layers 232 and first metal lines 242. The first metal lines 242 are thus self-aligned with the metal barrier layers 232. Note, although the top electrodes 230 and the metal barrier layers 232 are each shown as being formed in the shape of a plug (FIG. 4H), alternatively, the top electrodes 230 and/or the metal barrier layers 232 may each be formed in the shape of a box as depicted in FIG. 5A.

Referring to FIG. 6C, a fifth insulation layer 250 is formed on the fourth insulation layer 220. The fourth and fifth insulation layers 220 and 250 are then patterned in the memory cell array region to form top word line contact holes 257 each of which exposes a bottom metal stud 200. At the same time, the fifth insulation layer 250 is patterned in the peripheral circuit region to form a via hole 256 which exposes a first metal line 242. Alternatively, though, the via hole 256 may be formed before or after the top word line contact hole 257 is formed.

Each top word line contact hole 257 is filled with metallic material to form a top metal stud 263 electrically connected to a bottom metal stud 200. The bottom and top metal studs 200 and 263 constitute a word line contact 291 electrically connected to a word line 130. At the same time, a via 261 is formed by filling the via hole 256 with metallic material. Alternatively, though, the via 261 may be formed before or after the top metal studs 263 are formed.

Figure 6D:
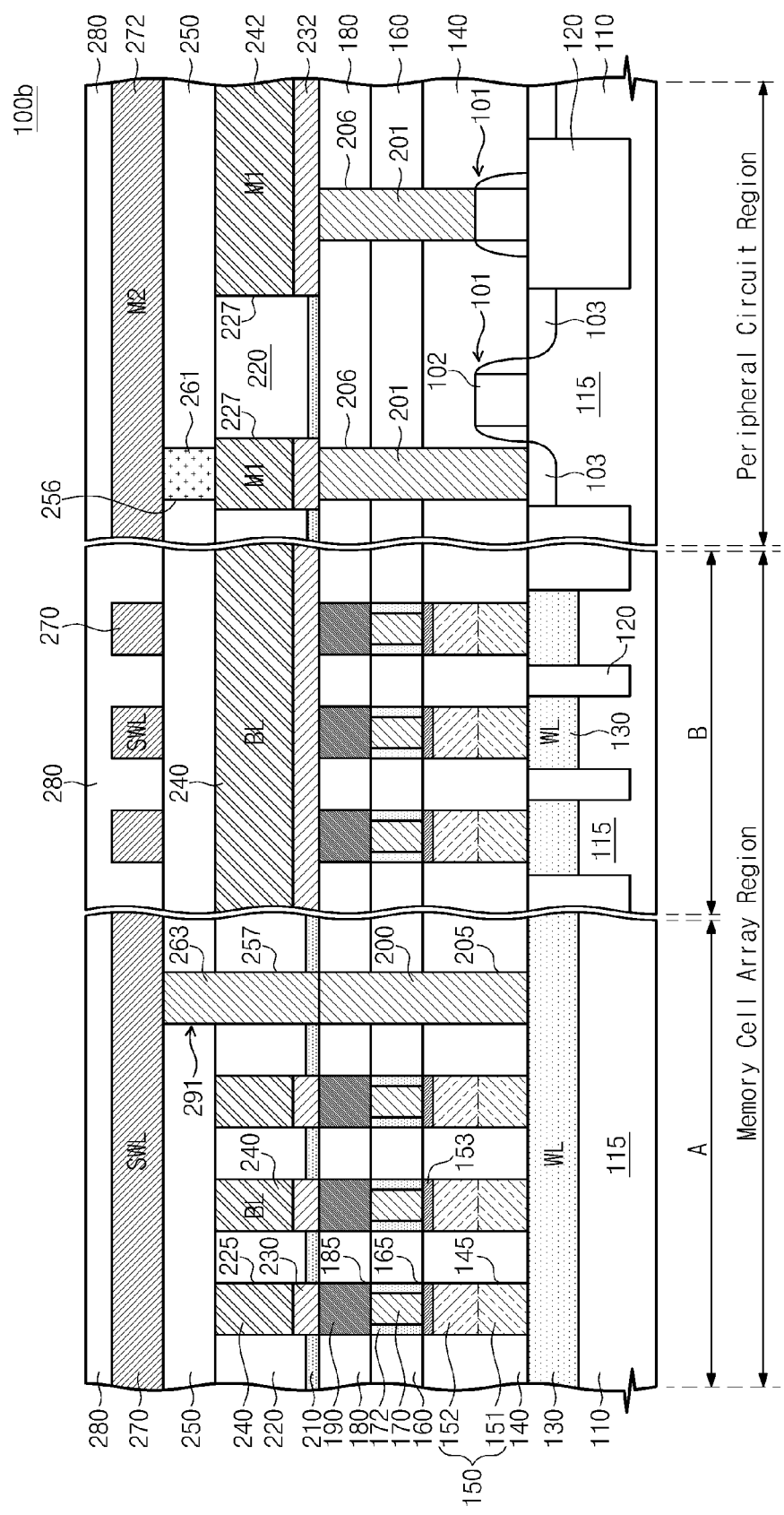

Referring to FIG. 6D, strapping word lines 270 electrically connected to the word line contacts 291 and a second metal line 272 electrically connected to the via 261 are formed on the fifth insulation layer 250. The strapping word lines 270 may be formed simultaneously with the the second metal line 272. A sixth insulation layer 280 is then formed by depositing insulative material, e.g., $SiO_2$, on the fifth insulation layer 250 to such a thickness as to cover the strapping word lines 270 and the second metal line 272.

Figure 7A:
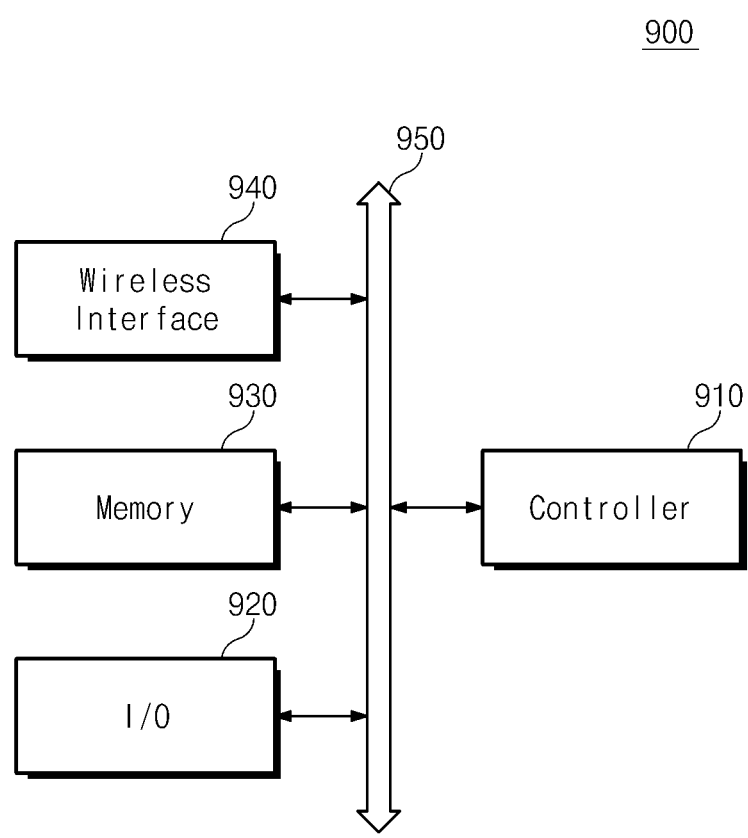
FIG. 7A is a block diagram of an electronic device having a memory to which the inventive concept can be applied.
Figure 7B:
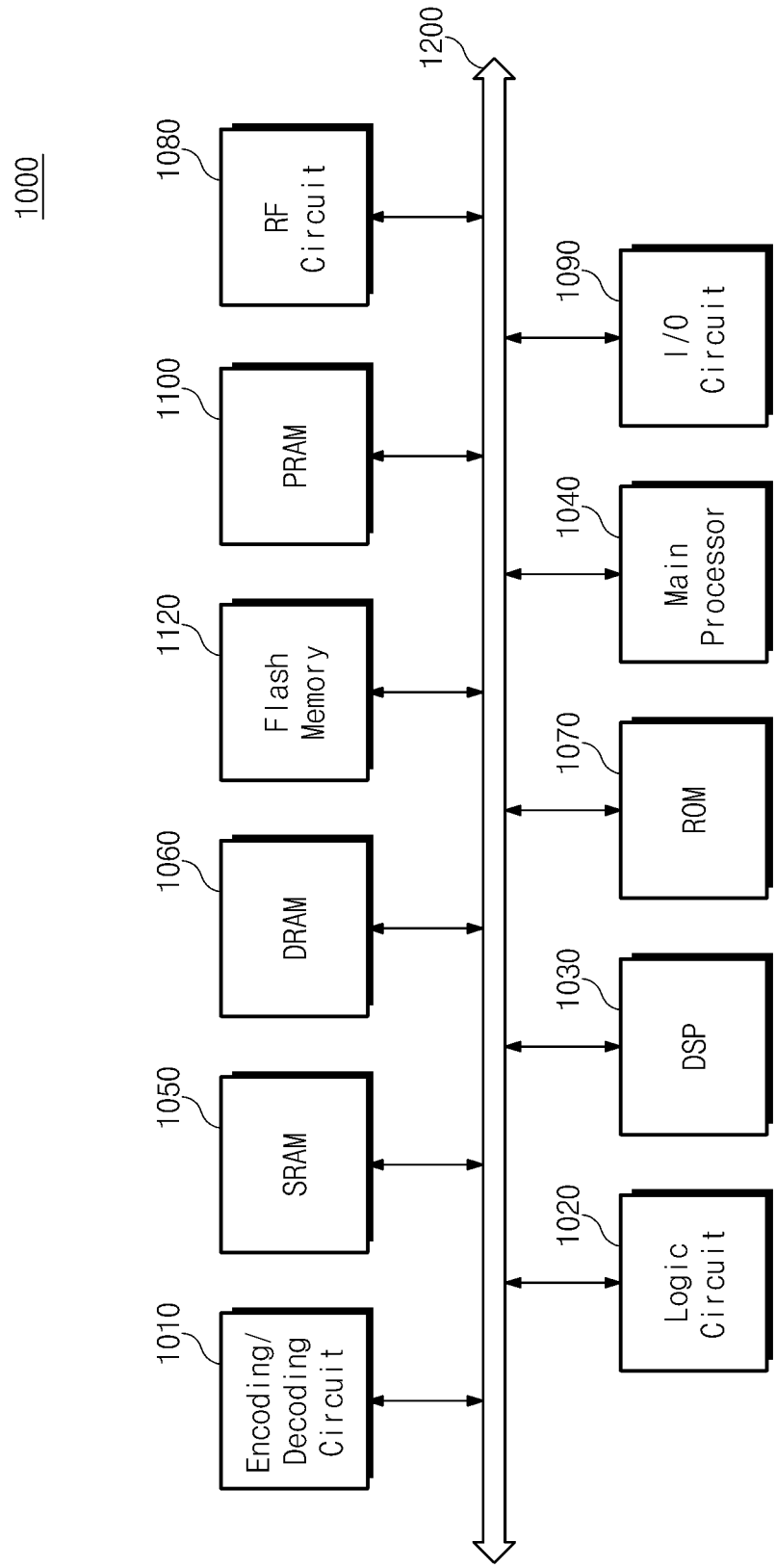
FIG. 7B is a block diagram of another electronic device to which the inventive concept can be applied.

FIGS. 7A and 7B illustrate electronic devices that include a phase change memory made according to the inventive concept.

Referring to FIG. 7A, an electronic device 900 includes a controller 910, an input/output (I/O) interface 920, a memory 930, and a wireless interface 940 which are interconnected by one or more communication buses 950. The electronic device 900 may be any type of consumer electronic device, for example. In this case, the controller 910 can be configured to provide various user applications which communicate with one or more users through the I/O interface 920. The I/O interface 920 may include, but is not limited to, a keyboard, a touch interface, a display, a speaker, and/or a microphone.

The wireless interface 940 may be configured to communicate with another electronic device via radio frequency and/or infrared signals. The controller 910, the I/O interface 920, and/or the wireless interface 940 may be configured to read/write data and/or program instructions in the memory 930.

The memory 930 includes a phase change memory device manufactured according to the inventive concept. Accordingly, the phase change memory device may be configured as shown in FIG. 3, FIG. 4J, FIG. 5B or FIG. 6C. The memory 930 may also include a nonvolatile memory device of a different type, i.e., of a type other than a phase change memory, and/or a volatile memory such as DRAM.

Referring to FIG. 7B, an electronic device 1000 may be, but is not limited to, a wireless communication device configured as a cellular voice/data communication terminal. The wireless communication device 1000 may include an encoding/decoding circuit 1010, a logic circuit 1020, a digital signal processor (DSP) 1030, a main processor 1040, a SRAM 1050, a DRAM 1060, a ROM 1070, an RF circuit 1080, an I/O circuit 1090, a phase change memory 1100, and a flash memory 1120. The wireless communication device 1000 can be configured in a conventional manner to provide cellular voice/data communication with remote cellular radio transceiver base stations and cellular communication networks, and/or to provide wireless local/wide area network communication with remote wireless network routers.

To these ends, the encoding/decoding circuit 1010 and the DSP 1030 may be configured, for example, to communicate using one or more cellular communication protocols such as Advance Mobile Phone Service (AMPS), ANSI-136 (TDMA), Global Standard for Mobile (GSM) communication, General Packet Radio Service (GPRS), enhanced data rate for GSM evolution (EDGE), code division multiple access (CDMA), wideband-CDMA, CDMA2000, and Universal Mobile Telecommunications System (UMTS), and/or using a Bluetooth protocol and/or one or more wireless location area network protocols such as 802.11a, 802.11b, 802.11e, 802.11g, 802.11i and/or 802.11n.

The phase change memory 1100 is manufactured in accordance with the inventive concept. Accordingly, the phase change memory 1100 may be configured as shown in FIG. 3, FIG. 4J, FIG. 5B or FIG. 6C.

Finally, embodiments of the inventive concept have been described herein in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A method of manufacturing a phase change memory device having a memory cell array region containing an array of memory cells and a peripheral circuit region containing transistors for driving the array, the method comprising:
providing a substrate having an upper surface and which includes a semiconductor substrate, a word line at an upper portion of the semiconductor substrate in the cell array region, a layer of phase-change material disposed on and electrically connected to the word line, and a bottom metal stud exposed at the upper surface of the substrate and contacting the word line; and
performing a damascene process comprising:
forming on the upper surface of the substrate an insulation layer that covers the layer of phase-change material and the bottom metal stud,
forming a phase change contact hole that extends through the insulation layer and exposes the layer of phase-change material,
forming a top word line contact hole that extends through the insulation layer and exposes the bottom metal stud,
forming both a top electrode on the layer of phase-change material and a bit line on the top electrode within the phase change contact hole, wherein the bit line is self-aligned with the top electrode, and
forming a second metal stud in the top word line contact hole and in contact with the bottom metal stud.

2. The method of claim 1, wherein the damascene process comprises:
filling a bottom portion of the phase change contact hole to thereby form the top electrode; and
filling a remaining portion of the contact hole to thereby form the bit line.

3. The method of claim 2, wherein the providing of the substrate comprises:
forming a switch electrically connected to the word line;
forming a bottom electrode on the switch;
forming the layer of phase-change material on the bottom electrode;
forming a bottom word line contact hole extending from the word line to the upper surface of the substrate; and
forming the bottom metal stud in the bottom word line contact hole.

4. The method of claim 3, wherein the word line contact hole, which exposes the bottom metal stud, is formed at the same time the phase change contact hole is being formed.

5. The method of claim 4, wherein the
second metal stud is formed at the same time the top electrode is being formed; and the damascene process also comprises:
forming a third metal stud on the second metal stud at the same time the bit line is being formed.

6. The method of claim 1, wherein the forming of the layer of phase change material comprises forming a layer of a chalcogenide on the semiconductor substrate.

7. The method of claim 6, wherein the damascene process comprises:
forming the top electrode directly on the chalcogenide with a first process which comprises depositing in the phase change contact hole at least one material selected from the group consisting of TiN, TiAlN, TaN, WN, MoN, NbN, TiSiN, TiBN, ZrSiN, WSiN, WBN, ZrAlN, MoAlN, TaSiN, TaAlN, TiW, TiAl, TiON, TiAlON, WON, and TaON; and
forming the bit line with a second process, discrete from the first process, and which comprises depositing in the phase change contact hole at least one conductive material selected from of the group consisting of Ti, W, Si, Cu, Ta, Mo, Ru, Al, Au, Pt, Ag and alloys thereof.

8. The method of claim 1, wherein the damascene process comprises:
forming the top electrode with a first process which comprises depositing in the hole at least one material selected from the group consisting of TiN, TiAlN, TaN, WN, MoN, NbN, TiSiN, TiBN, ZrSiN, WSiN, WBN, ZrAlN, MoAlN, TaSiN, TaAlN, TiW, TiAl, TiON, TiAlON, WON, and TaON; and
forming the bit line with a second process, discrete from the first process, and which comprises depositing in the hole at least one conductive material selected from of the group consisting of Ti, W, Si, Cu, Ta, Mo, Ru, Al, Au, Pt, Ag and alloys thereof.

9. The method of claim 1, further comprising forming an etch stop layer on the upper surface of the substrate before forming the insulation layer.

10. The method of claim 9, wherein the forming of the phase change contact hole and the forming of the top word line contact hole comprises removing portions of the etch stop layer to expose the layer of phase change material and the bottom stud, respectively, and further comprising:
cleaning the phase change material layer which is exposed by the removing of a respective portion of the etch stop layer; and
surface treating the exposed phase change material layer using radio frequency energy.

11. A method of manufacturing a phase change memory device having a memory cell array region containing an array of memory cells and a peripheral circuit region containing transistors for driving the array, the method comprising:
providing a substrate having an upper surface and which includes a semiconductor substrate, a word line at an upper portion of the semiconductor substrate in the memory cell array region, a layer of phase-change material disposed on and electrically connected to the word line, and a bottom metal stud exposed at the upper surface of the substrate and contacting the word line; and
performing a damascene process comprising:
forming on the upper surface of the substrate an insulation layer that covers the layer of phase-change material and the bottom metal stud,
forming a phase change contact hole that extends through the insulation layer and exposes the layer of phase-change material, and a top word line contact hole that extends through the insulation layer and exposes the bottom metal stud,
simultaneously forming within the phase change contact hole a top electrode on the layer of phase-change material and within the word line contact hole an intermediate metal stud on the bottom metal stud,
subsequently simultaneously forming a bit line on the top electrode within the phase change contact hole and a top metal stud on the intermediate metal stud within the top word line contact hole,
wherein the bit line is self-aligned with the top electrode, the top metal stud is self-aligned with the intermediate metal stud, the top electrode and the intermediate stud are formed of the same material, and the bit line and the top metal stud are formed of the same material, and the material constituting the bit line and the top electrode is different from that of the material constituting both the top electrode and intermediate stud.

12. The method of claim 11, wherein the forming of the layer of phase change material comprises forming a chalcogenide, the forming of the top electrode and the intermediate metal stud comprises depositing in the phase change contact hole and the word line contact hole at least one material selected from the group consisting of TiN, TiAlN, TaN, WN, MoN, NbN, TiSiN, TiBN, ZrSiN, WSiN, WBN, ZrAlN, MoAlN, TaSiN, TaAlN, TiW, TiAl, TiON, TiAlON, WON, and TaON, and the forming of the bit line and the top metal stud comprises depositing in upper parts of the phase change contact hole and the word line contact hole at least one conductive material selected from of the group consisting of Ti, W, Si, Cu, Ta, Mo, Ru, Al, Au, Pt, Ag and alloys thereof.

* * * * *